(12) United States Patent
Yamauchi

(10) Patent No.: US 9,297,500 B2
(45) Date of Patent: Mar. 29, 2016

(54) LIGHT EMITTING MODULE, LIGHTING DEVICE, AND LIGHTING APPARATUS

(71) Applicant: PANASONIC CORPORATION, Osaka (JP)

(72) Inventor: Kentaro Yamauchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 99 days.

(21) Appl. No.: 14/467,377

(22) Filed: Aug. 25, 2014

(65) Prior Publication Data

US 2015/0070887 A1 Mar. 12, 2015

(30) Foreign Application Priority Data

Sep. 11, 2013 (JP) ................................ 2013-188282

(51) Int. Cl.
| | | |
|---|---|---|
| *F21V 9/00* | (2015.01) | |
| *F21K 99/00* | (2010.01) | |
| *H01L 25/075* | (2006.01) | |
| *H01L 33/54* | (2010.01) | |
| *F21Y 101/02* | (2006.01) | |
| *F21Y 103/00* | (2006.01) | |
| *F21Y 105/00* | (2006.01) | |
| *H01L 33/50* | (2010.01) | |

(52) U.S. Cl.
CPC ............ *F21K 9/135* (2013.01); *H01L 25/0753* (2013.01); *F21Y 2101/02* (2013.01); *F21Y 2103/003* (2013.01); *F21Y 2105/001* (2013.01); *H01L 33/505* (2013.01); *H01L 33/54* (2013.01); *H01L 2924/0002* (2013.01)

(58) Field of Classification Search
CPC ..... F21K 9/135; H01L 25/0753; H01L 33/54; H01L 33/505; H01L 2924/0002; H01L 2924/00; H01L 33/52; H01L 33/56; F21Y 2101/02; F21Y 2103/003; F21Y 2105/001; F21Y 2103/00
USPC ............ 362/231, 236, 237, 217.01, 223, 224, 362/267; 257/100, 102, 88, 89, 787–796
See application file for complete search history.

(56) References Cited

U.S. PATENT DOCUMENTS

| | | | |
|---|---|---|---|
| 8,564,215 B2 | 10/2013 | Okawa et al. | |
| 9,065,024 B2* | 6/2015 | Tong | ..................... H01L 33/507 |
| 2012/0032202 A1* | 2/2012 | Ogata | ................ G02F 1/133603 |
| | | | 257/88 |
| 2013/0187178 A1* | 7/2013 | Tischler | ................... H01L 33/50 |
| | | | 257/88 |
| 2014/0209943 A1 | 7/2014 | Yamamoto et al. | |

FOREIGN PATENT DOCUMENTS

JP 2008-235458 10/2008

*Primary Examiner* — Anh Mai
*Assistant Examiner* — Glenn Zimmerman
(74) *Attorney, Agent, or Firm* — Greenblum & Bernstein, P.L.C.

(57) ABSTRACT

A light-emitting module includes: a first light-emitting element that emits light from an upper surface and side surfaces thereof; a second light-emitting element that mainly emits light from an upper surface thereof; a first sealer; and a second sealer. A first ratio, defined as a ratio of a heightwise distance from a top of the first sealer to the upper surface of the substrate with respect to a width of the first sealer at the upper surface of the substrate, is larger than a second ratio, defined as a ratio of a heightwise distance from a top of the second sealer to the upper surface of the second light-emitting element with respect to a width of the second sealer at a position corresponding to the upper surface of the second light-emitting element. A ratio of the first ratio to the second ratio is less than 1.85.

9 Claims, 18 Drawing Sheets

FIG. 8

| Embodiment example | Length of one side of rectangular upper surface of light-emitting element 120 | Length of one side of rectangular upper surface of light-emitting element 130 | Height of light-emitting element 120 | Height of light-emitting element 130 | Outer diameter of sealer 140 at position corresponding to lower edge of light-emitting region at each side surface of light-emitting element 120 (Outer diameter of bottom of sealer 140) | Outer diameter of sealer 150 at position corresponding to light-emitting region of light-emitting element 130 (Outer diameter of sealer 150 at position corresponding to upper surface of light-emitting element 130) |
|---|---|---|---|---|---|---|
| 1 | 500 | 500 | 140 | 250 | 1200 | 1200 |
| 2 | 500 | 500 | 250 | 250 | 1200 | 1200 |
| 3 | 500 | 500 | 140 | 250 | 1200 | 2500 |
| 4 | 500 | 500 | 250 | 250 | 1200 | 2500 |

In unit of μm

LIGHT EMITTING MODULE, LIGHTING DEVICE, AND LIGHTING APPARATUS

CROSS-REFERENCE TO RELATED APPLICATION

The disclosure of Japanese Patent Application No. 2013-188282 filed Sep. 11, 2013 including specification, drawings and claims is incorporated herein by reference in its entirety.

TECHNICAL FIELD

The present disclosure relates to a light-emitting module, a lighting device, and a lighting apparatus that each use a light-emitting element such as an LED (light-emitting diode), and in particular to a technology for reducing the color unevenness of light emitted from light-emitting modules.

BACKGROUND ART

Conventionally, there have been light-emitting modules, as commercialized products, that convert a portion of blue light emitted from a blue LED into yellow light with use of a wavelength conversion material, and that mix an unconverted portion of the blue light and the yellow light resulting from the conversion to obtain white light.

However, white light obtained by such light-emitting modules as described above tends to have poor color rendering properties since the white light does not contain a sufficient amount of red component. Accordingly, Japanese Unexamined Patent Application Publication No. 2008-235458 proposes a technique for obtaining white light having excellent color rendering properties by supplementing the white light with a red light component by means of a red LED that emits red light, and mixing blue light, yellow light, and red light.

However, the structure disclosed in Japanese unexamined patent application publication No. 2008-235458 has the following problem. Suppose that a white light source and a red light source have different light distribution characteristics. In this case, a difference occurs in the relative illuminance of each color light source at the central portion and peripheral portion of the illumination target surface. Also, variations in light chromaticity occur between the central portion and peripheral portion of illumination light.

It is desirable that regardless of the difference in the light distribution characteristics of each color light source, the color unevenness of illumination light be suppressed by reducing the difference in the illuminance ratio of each color light source at the central portion and peripheral portion of the illumination target surface.

In view of the above problem, an aim of the present disclosure is to provide a light-emitting module that reduces the color unevenness of illumination light.

SUMMARY OF THE INVENTION

To achieve the aim, a light-emitting module according to one aspect of the present disclosure includes: a substrate; a first light-emitting element and a second light-emitting element that are each provided on an upper surface of the substrate and each emit light having a different peak wavelength; a first sealer that covers the first light-emitting element and includes a light-transmissive material; and a second sealer that covers the second light-emitting element and includes the same type of material as the light-transmissive material. The first light-emitting element emits light from an upper surface and side surfaces thereof. The second light-emitting element mainly emits light from an upper surface thereof. A first ratio that is defined as, in a vertical cross section of the first sealer that passes through a center of the upper surface of the first light-emitting element, a ratio of a heightwise distance from a top of the first sealer to the upper surface of the substrate with respect to a width of the first sealer at the upper surface of the substrate, is larger than a second ratio that is defined as, in a vertical cross section of the second sealer that passes through a center of the upper surface of the second light-emitting element, a ratio of a heightwise distance from a top of the second sealer to the upper surface of the second light-emitting element with respect to a width of the second sealer at a position corresponding to the upper surface of the second light-emitting element. A ratio of the first ratio to the second ratio is less than 1.85.

In the light-emitting module according to one aspect of the present disclosure, the ratio of the first ratio to the second ratio may be at least 1.25 and at most 1.65.

In the light-emitting module according to one aspect of the present disclosure, the ratio of the first ratio to the second ratio may be at least 1.5 and at most 1.65.

The light-emitting module according to one aspect of the present disclosure may further include: a third light-emitting element that emits light having the same peak wavelength as the first light-emitting element; and a fourth light-emitting element that emits light having the same peak wavelength as the second light-emitting element. The third light-emitting element may be provided on the upper surface of the substrate and aligned with the first light-emitting element to form a first light-emitting element column. The fourth light-emitting element may be provided on the upper surface of the substrate and aligned with the second light-emitting element to form a second light-emitting element column. The first sealer and the second sealer may have a strip-like shape, and respectively cover the first light-emitting element column and the second light-emitting element column.

In the light-emitting module according to one aspect of the present disclosure, the light emitted by the first light-emitting element may be blue light, and the light emitted by the second light-emitting element may be red light.

In the light-emitting module according to one aspect of the present disclosure, the first sealer may include a wavelength conversion material, the wavelength conversion material converting a wavelength of a portion of the blue light into a wavelength of light having a different color, so as to emit, as light from the light-emitting module as a whole, white light obtained by mixing the blue light, the red light, and the light having the different color.

In the light-emitting module according to one aspect of the present disclosure, the peak wavelength of the blue light may be at least 440 nm and at most 470 nm, and the peak wavelength of the red light may be at least 600 nm and at most 660 nm.

Another aspect of the present disclosure is a lighting device including the light-emitting module described above.

Another aspect of the present disclosure is a lighting apparatus including the light-emitting module described above.

With the above-described structure, the light-emitting module according to one aspect of the present disclosure allows the illumination regions illuminated with the lights of light sources of different emission colors, such as an illumination region illuminated with the light of a white light source and an illumination region illuminated with a red light source, to be substantially the same. Also, there is little difference in the illuminance ratio of each of the light sources at the central portion and peripheral portion of the illumination region on the illumination target surface. This suppresses color unevenness which is found at the central portion and peripheral portion of the illumination region illuminated by a conventional lighting device.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 7A shows a manner of color mixing by a lighting device according to the embodiment, and FIG. 7B shows a manner of color mixing by a lighting device according to a comparative example;

FIG. 8 shows the outlines of light-emitting modules of embodiment examples 1 to 4 used for optical simulations according to the embodiment;

FIG. 10A is a plan view, FIG. 10B is a right side view, and FIG. 10C is a frontal view;

FIG. 12A is a plan view, FIG. 12B is a right side view, and FIG. 12C is a frontal view;

DETAILED DESCRIPTION

Embodiment

The following describes a light-emitting module, a lighting device, and a lighting apparatus according to an embodiment of the present disclosure, with reference to the drawings.

<Lighting Apparatus>

Figure 1:
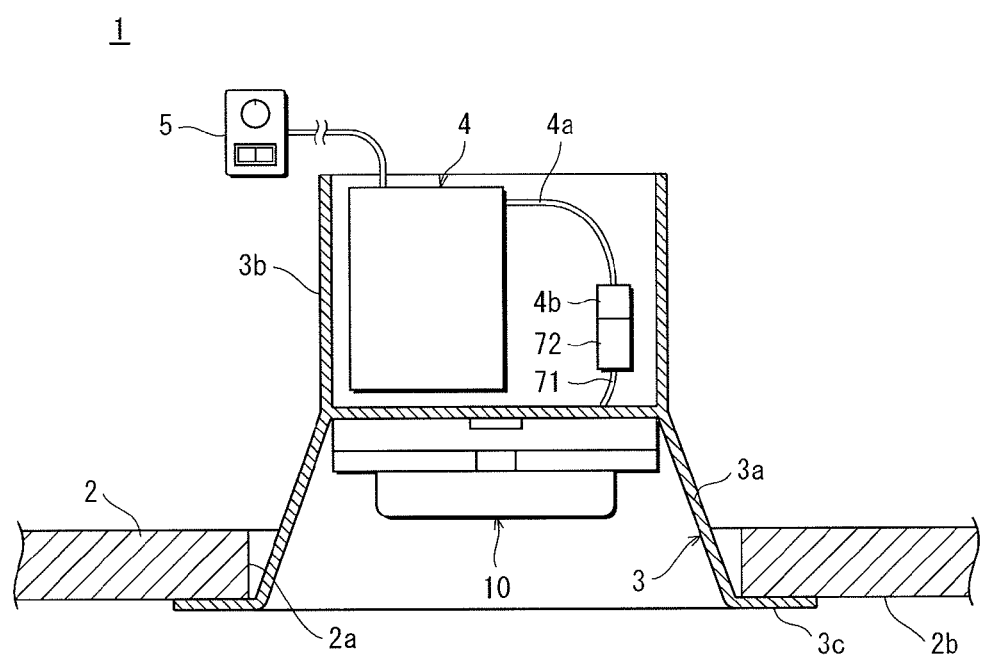
FIG. 1 is a cross-sectional view showing a lighting apparatus according to an embodiment.

FIG. 1 is a cross-sectional view showing a lighting apparatus according to the present embodiment. As shown in FIG. 1, a lighting apparatus 1 according to the present embodiment is, for example, a downlight installed by being embedded in a ceiling 2, and includes a lighting fixture 3, a circuit unit 4, a dimming unit 5, and a lighting device 10.

The lighting fixture 3 is made of metal, for example, and includes a lamp housing 3a, a circuit housing 3b, and an outer flange 3c. The lamp housing 3a has a bottomed-cylindrical shape, for example, and the lighting device 10 is detachably attached to the inside of the lamp housing 3a. The circuit housing 3b extends toward the bottom of the lamp housing 3a, for example, and houses the circuit unit 4 therein. The outer flange 3c has an annular shape, for example, and extends outward from an edge of an opening of the lamp housing 3a. The lighting fixture 3 is fixed to the ceiling 2 by screws (omitted from the drawing) or the like, for example, in the state with the lamp housing 3a and the circuit housing 3b being embedded in an embedding hole 2a which penetrate through the ceiling 2, and the outer flange 3c being in contact with the peripheral portion of the embedding hole 2a at a lower surface 2b of the ceiling 2.

The circuit unit 4 lights the lighting device 10, and has a power line 4a that is electrically connected to the lighting device 10. One end of the power line 4a is connected to a connector 4b which is detachably connected to a connector 72 of lead lines 71 of the lighting device 10.

The dimming unit 5 is provided so that the user can adjust the brightness of the illumination light emitted from each of the light-emitting elements in the lighting device 10. The dimming unit 5 is electrically connected to the circuit unit 4, and outputs a dimming signal to the circuit unit 4 in response to a user operation.

<Lighting Device>

Figure 2:
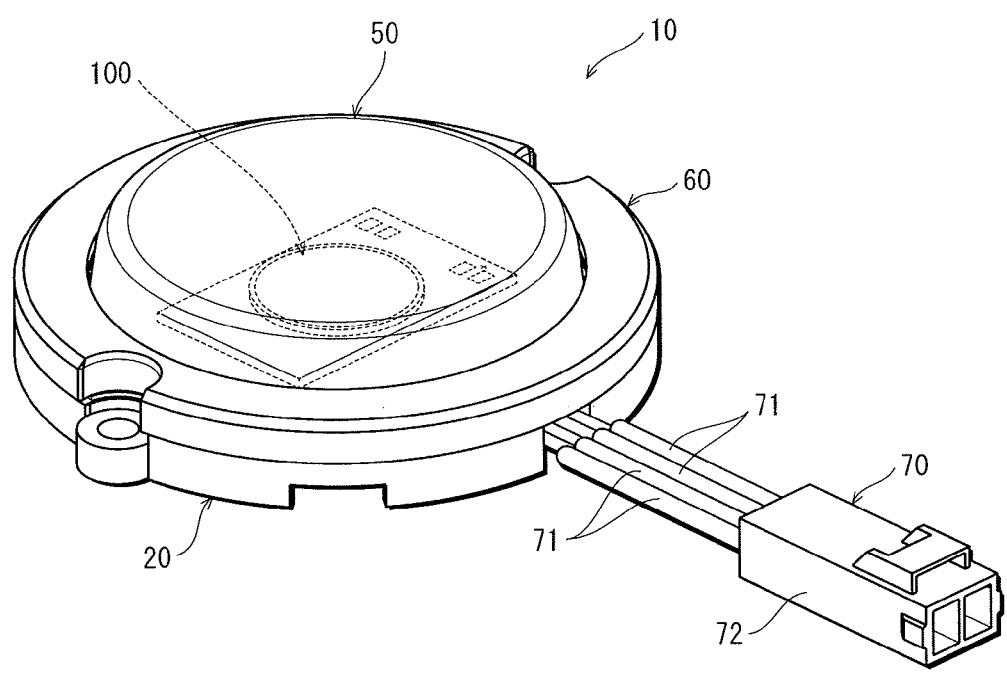
FIG. 2 is a perspective view showing a lighting device according to the embodiment.
Figure 3:
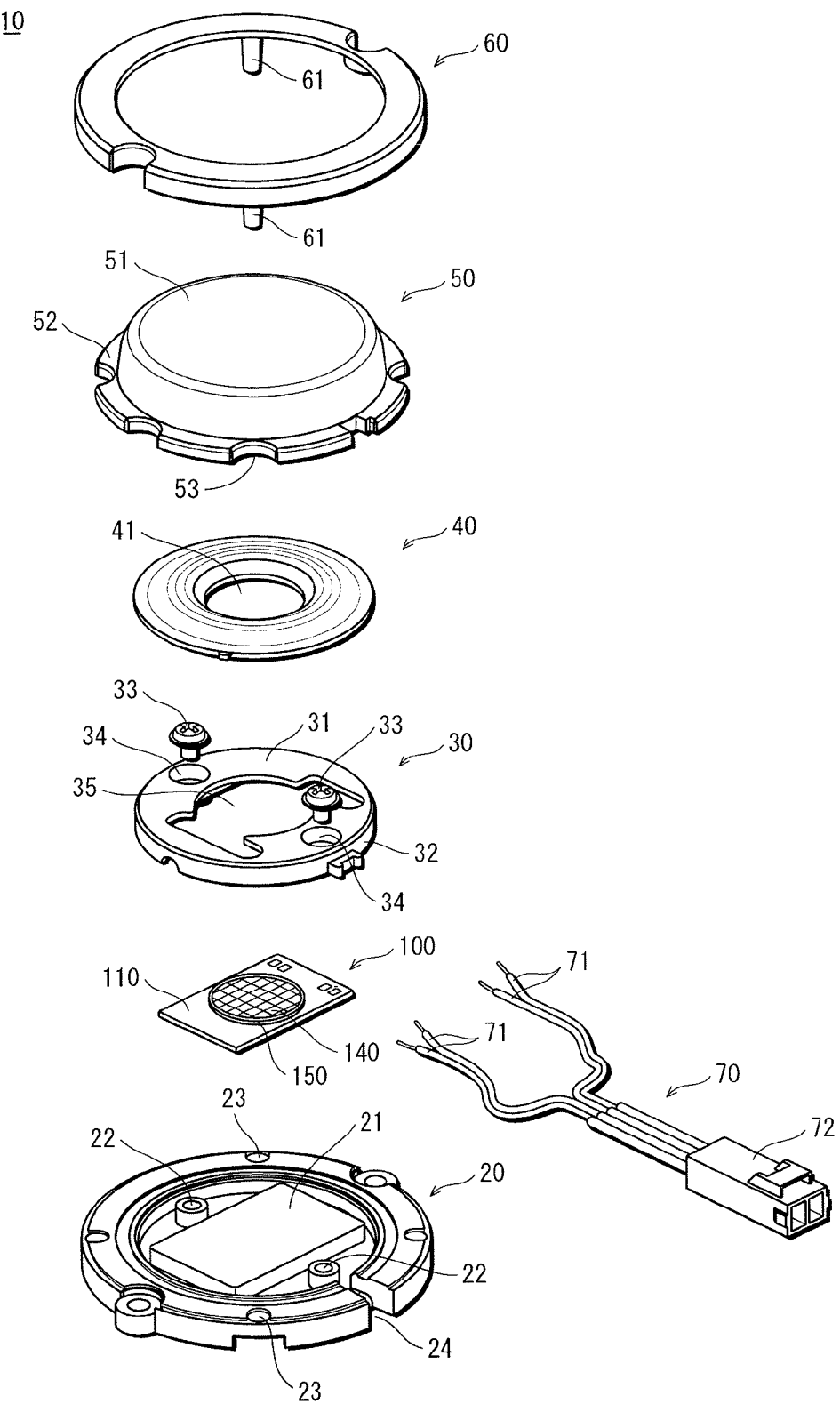
FIG. 3 is an exploded perspective view showing a lighting device according to the embodiment.

FIG. 2 is a perspective view showing a lighting device according to the present embodiment. FIG. 3 is an exploded perspective view showing a lighting device according to the present embodiment. As shown in FIGS. 2 and 3, the lighting device 10 according to the present embodiment is a lamp unit, for example, and includes a base 20, a holder 30, a decoration cover 40, a cover 50, a cover holder 60, a wiring member 70, and a light-emitting module 100.

The base 20 has a disc-like shape and is made by aluminum die-casting, for example. The base 20 has a mounting portion 21, which is provided at the center of the upper surface of the base 20, and the light-emitting module 100 is mounted on the mounting portion 21. The base 20 also has screw holes 22, which are provided in the upper surface of the base 20 and flank the mounting portion 21. The screw holes 22 are provided to engage with assembly screws 33 for fixing the holder 30. Furthermore, the base 20 has boss holes 23 and a cut 24, which are provided in the peripheral portion of the base 20.

The holder 30 has a bottomed-cylindrical shape, for example, and has a disc-like holder plate 31 and a cylindrical peripheral wall 32 extending from the peripheral edge of the holder plate 31 toward the base 20. The holder plate 31 of the holder 30 has insertion holes 34, which are provided in the peripheral portion of the holder plate 31. The insertion holes 36 correspond in position to the screw holes 22 of the base 20, and receive the assembly screws 33. The holder 30 is fixed to the base 20 with the holder plate 31 pressing the light-emitting module 100 toward the mounting portion 21, and the assembly screws 33 in the insertion holes 34 being screwed into the screw holes 22 of the base 20. With the holder 30 being fixed to the base 20, first sealers 140 and second sealers 150 of the light-emitting module 100 (hereinafter the first sealers 140 and the second sealers 150 are simply referred to as "sealers 140" and "sealers 150", and details thereof are described later) are exposed through a window 35 formed at the center of the holder plate 31.

The decoration cover 40 has an annular shape and is made of a non-light-transmissive material such as opaque white resin, for example. The decoration cover 40 is provided between the holder 30 and the cover 50, and covers the lead lines 71, the assembly screws 33, etc. The decoration cover 40 has a window 41, which is provided at the center of the decoration cover 40. The sealers 140 and 150 of the light-emitting module 100 are exposed through the window 41.

The cover 50 is made of a light-transmissive material such as silicone resin, acrylic resin, or glass, for example. The light emitted from the light-emitting module 100 passes through the cover 50 and travels outward from the lighting device 10. The cover 50 includes a main body 51 and an outer flange 52. The main body 51 has a dome shape covering the sealers 140 and 150 and serves as a lens. The outer flange 52 extends outward from the peripheral portion of the main body 51 and is fixed to the base 20. The outer flange 52 has cuts 53 each having a semicircular shape. The cuts 53 are located in correspondence with bosses 61 of the cover holder 60 in order to make way for the bosses 61. Note that the main body 51 may not serve as a lens.

The cover holder 60 is made of a non-light-transmissive material such as metal (e.g., aluminum) or opaque white resin. The cover holder 60 has an annular plate shape so as not to block the light emitted from the main body 51 of the cover 50. The cover holder 60 has bosses 61, which are provided at the lower surface of the cover holder 60. The bosses 61 have a columnar shape protruding toward the base 20. The cover holder 60 is fixed to the base 20 as follows. First, the bosses 61 of the cover holder 60 are inserted through the boss holes 23 of the base 20. Then, the tips of the respective bosses 61 are irradiated with a laser beam from under the base 20, so that the tips are plastically deformed and do not slip through the boss holes 23.

The wiring member 70 has a pair of lead lines 71 electrically connected to the light-emitting module 100, and the connector 72 is connected to the ends of the lead lines 71 that are opposite the ends thereof connected to the light-emitting module 100. The lead lines 71 of the wiring member 70 connected to the light-emitting module 100 are led out of the lighting device 10 via the cut 24 of the base 20.

<Light-Emitting Module>

(Overall Structure)

Figure 4A:
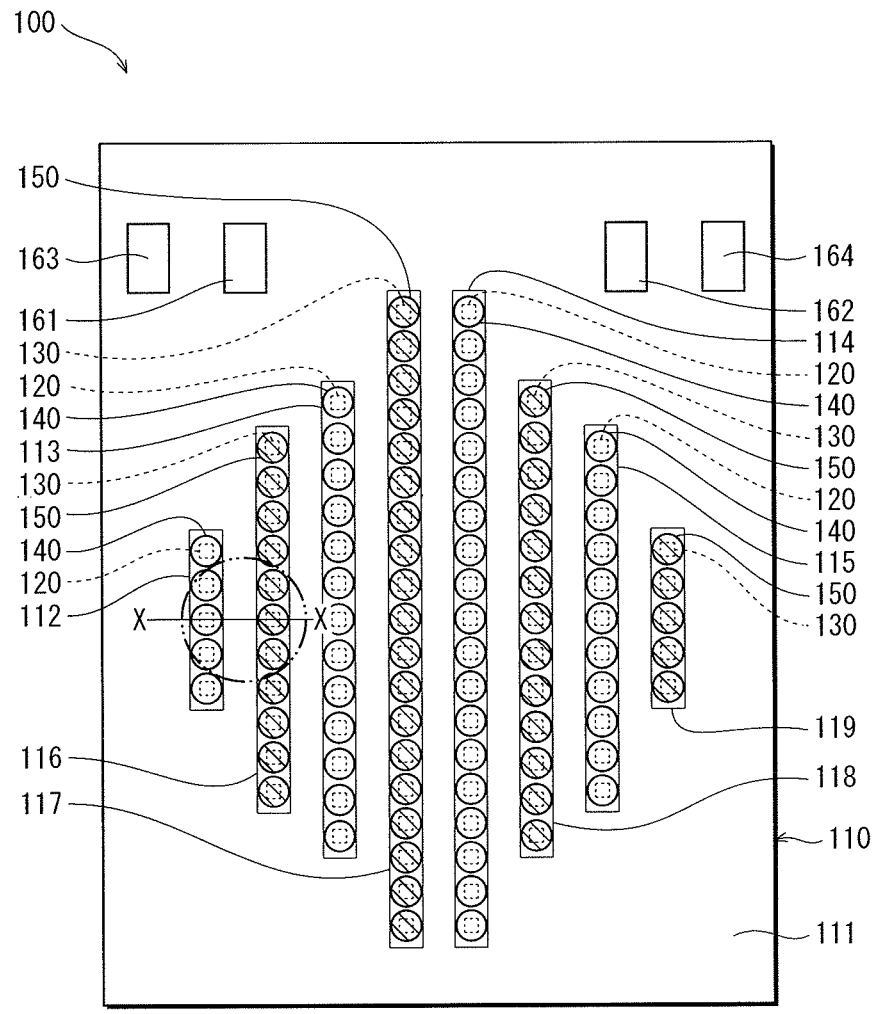
FIG. 4A is a plan view showing a light-emitting module according to the embodiment.
Figure 4B:
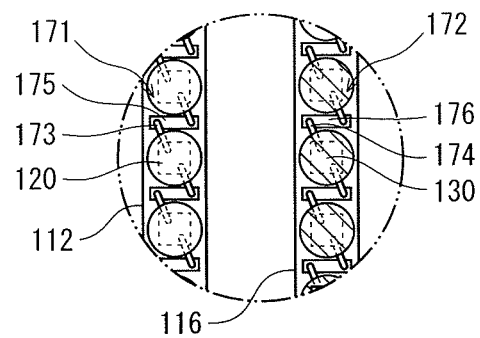
FIG. 4B is a magnified plan view showing a main part of the light-emitting module.

FIG. 4A is a plan view showing a light-emitting module according to the present embodiment. FIG. 4B is a magnified plan view showing a main part of the light-emitting module shown in FIG. 4A. As shown in FIG. 4A, the light-emitting module 100 includes a substrate 110, a plurality of first light-emitting elements 120, a plurality of second light-emitting elements 130 (hereinafter "light-emitting elements 120" and "light-emitting elements 130", respectively), sealers 140, sealers 150, a plurality of terminals 161 to 164, wiring lines 171 and 172, and a heat-transfer member.

(Substrate)

The substrate 110 has, for example, a substantially rectangular plate-like shape, and has a two-layer structure composed of an insulating layer made of a ceramic plate, a heat-conductive resin, or the like, and a metal layer made of an aluminum plate or the like. On the upper surface 111 of the substrate 110, light-emitting element columns 112 to 115 are arranged at four locations. Each of the light-emitting element columns 112 to 115 is composed of a plurality of light-emitting elements 120 which are arranged in a column in plan view. Here, the plan view refers to a view from above in the direction perpendicular to the upper surface 111, and the same definition is applied in the following descriptions.

(Light-Emitting Elements)

Each light-emitting element 120 is, for example, made of indium gallium nitride (InGaN) formed on a sapphire substrate or the like. Each light-emitting element 120 is a blue LED that emits blue light having a peak wavelength of 440 nm to 470 nm. The light-emitting elements 120 are mounted face-up on the upper surface 111 of the substrate 110 by chip-on-board (COB) technology.

Each light-emitting element 120 has, for example, a cuboid shape having a rectangular upper surface of 500 μm×500 μm or 250 μm×250 μm and a height of 140 μm to 250 μm. In the present embodiment, each light-emitting element 120 has a cuboid shape having an upper surface of 500 μm×500 μm and a height of 140 μm or 250 μm, for example. Each light-emitting element 120, which has a cuboid shape composed of six surfaces, i.e., an upper surface, four side surfaces, and a bottom surface, emits light from the upper surface and the side surfaces. The light-emitting elements 120 are grouped such that each light-emitting element 120 belongs to one of four light-emitting element columns 112 to 115. The light-emitting element columns 112 to 115, each composed of light-emitting elements 120, are formed at four locations on the upper surface 111 of the substrate 110.

Each light-emitting element 130 is, for example, gallium aluminum arsenide (GaAlAs), aluminum indium gallium phosphide (AlInGaP), gallium arsenide phosphide (GaAsP), or the like, which is formed on a silicon substrate. For example, the light-emitting elements 130 are red LEDs that each emit red light having a peak wavelength of 600 nm to 660 nm. The light-emitting elements 130 are mounted face-up on the upper surface 111 of the substrate 110 by COB technology. Each light-emitting element 130 has a cuboid shape having a rectangular upper surface of 500 μm×500 μm and a height of 140 μm to 250 μm. In the present embodiment, each light-emitting element 130 has a cuboid shape having an upper surface of 500 μm×500 μm and a height of 250 μm, for example. Each light-emitting element 130, which has a cuboid shape composed of six surfaces, i.e., an upper surface, four side surfaces, and a bottom surface, emits light from the upper surface and parts of the side surfaces. Concerning each of the side surfaces, a light-emitting region from which light is emitted is a region surrounded by: a boundary line between the side surface and the upper surface; a horizontal line at the position approximately 20 μm below the boundary line; and a pair of boundary lines each being between the side surface and another side surface.

Similarly to the light-emitting elements 120, the light-emitting elements 130 are grouped such that each light-emitting element 130 belongs to one of four light-emitting element columns 116 to 119. The light-emitting element columns 116 to 119, each composed of light-emitting elements 130, are formed at four locations on the upper surface 111 of the substrate 110.

The light-emitting element columns 112 to 115 and the light-emitting element columns 116 to 119 are arranged substantially parallel to each other at equal intervals, and the longitudinal axis of each of the light-emitting element columns 112 to 115 and 116 to 119 is oriented in the same direction. The light-emitting element columns which are each composed of light-emitting elements 120, and the light-emitting element columns which are each composed of light-emitting elements 130, are arranged alternately so that light-emitting element columns of the same type are not adjacent with each other. This homogenizes the luminescent colors on the substrate 110.

(Sealers)

Each light-emitting element 120 is sealed by a sealer 140 made of a light-transmissive material. Each of the sealers 140 has a dome shape and is substantially circular in plan view, for example. The diameter of the bottom surface of each of the sealers 140 is approximately 1 mm to 3 mm. The sealers 140 seal the light-emitting elements 120 individually.

Each light-emitting element 130 is sealed by a sealer 150 made of a light-transmissive material. Similarly to the sealers 140, each of the sealers 150 has a dome shape and is substantially circular in plan view, for example. The diameter of the bottom surface of each of the sealers 150 is approximately 1 mm to 3 mm. The sealers 150 seal the light-emitting elements 130 individually. Examples of the light-transmissive material include: silicone resin; epoxy resin; fluorine resin; hybrid resin composed of silicone resin and epoxy resin; and urea-formaldehyde resin. It is desirable that the sealers 140 and the sealers 150 be made of the same type of resin materials categorized as: silicone resin; epoxy resin; fluorine resin; hybrid resin composed of silicone resin and epoxy resin; and urea-formaldehyde resin; or the like.

Furthermore, the light-transmissive material of the sealers 140 includes a wavelength conversion material, so that the sealers 140 serve as wavelength converters for converting light color. Examples of the wavelength conversion material include oxinitride phosphor such as sialon phosphor, sulfide phosphor, silicate-based phosphor, and a mixture of at least two of these phosphors. Note that the light-transmissive material of the sealers 140 may include a diffusion material, a heat dissipation material, or the like.

The peak wavelength of the light emitted from the light-emitting elements 120 is within a convertible wavelength range that allows the sealers 140 to perform wavelength conversion. Specifically, the sealers 140 convert the blue light emitted from the light-emitting elements 120 into a yellow light having a peak wavelength of 535 nm to 555 nm and a half width of 50 nm to 70 nm. Whether the peak wavelength of the light is within the convertible wavelength range or not can be determined based on the light conversion efficiency of the wavelength converters. When the light conversion efficiency of light at its peak wavelength is less than 10%, it can be determined that the peak wavelength is not within the convertible wavelength range.

The light-emitting elements 120 emit blue light, the light-emitting elements 130 emit red light, and the sealers 140 serving as wavelength converters convert a portion of the blue light into yellow light. Therefore, the light-emitting module 100 as a whole emits white light resulting from the mixture of the blue light, the red light, and the yellow light. Note that in the present description, the terms used to identify colors, such as blue, red, yellow, and white, are not intended to strictly adhere to the definition by the commission internationale de l'éclairage (CIE) (e.g. CIE defines that the wavelength of blue light is 435.8 nm, and the wavelength of red light is 700 nm), but they only identify approximate wavelength ranges of light. For this reason, when it is necessary to specify a precise wavelength of light, the wavelength is specified by using a numerical range.

Figure 5:
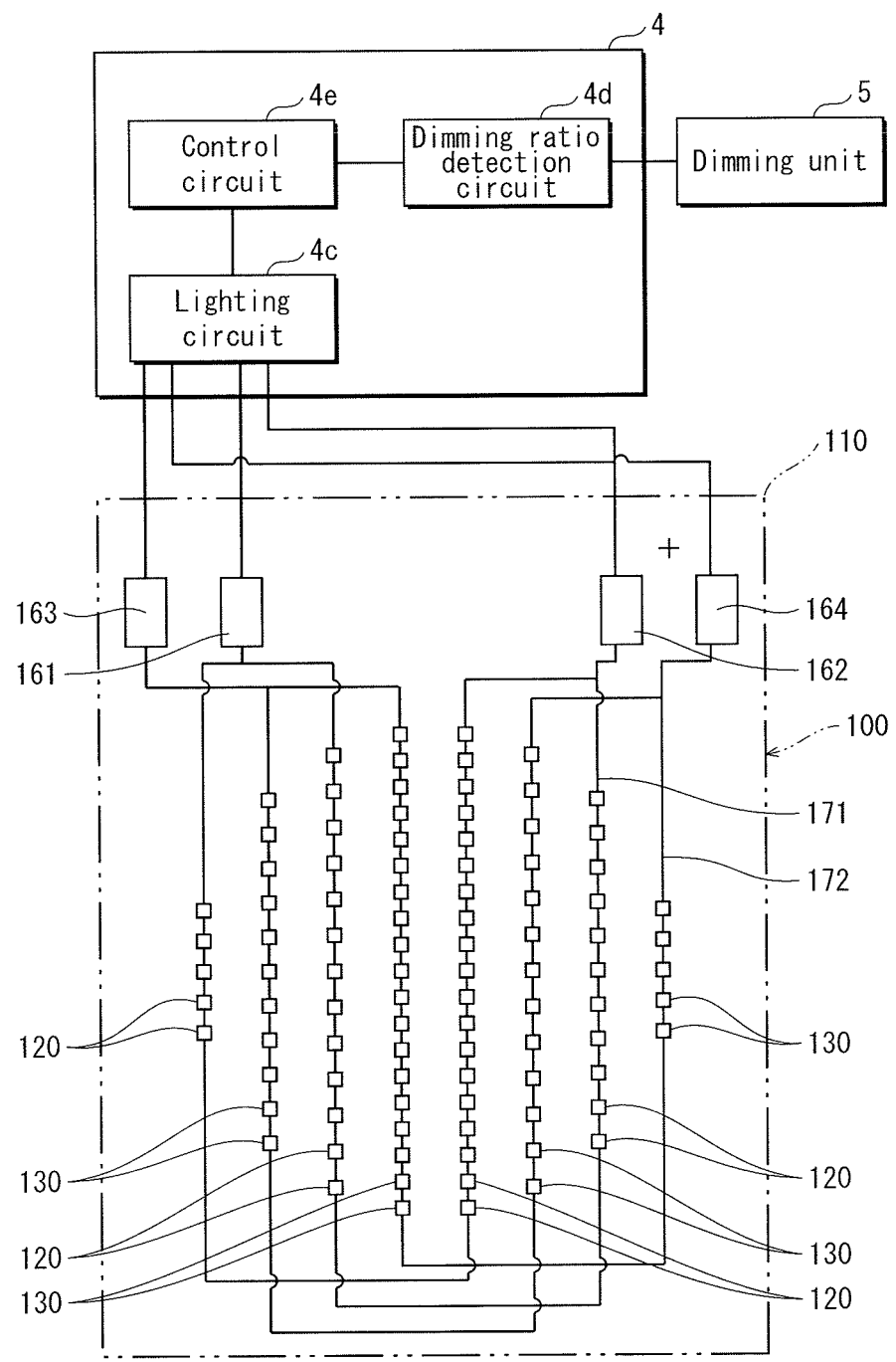
FIG. 5 is a wiring diagram showing the connections between light-emitting elements according to the embodiment.

FIG. 5 is a wiring diagram showing the connections between the light-emitting elements according to the present embodiment. As shown in FIG. 5, the wiring line 171 connects the light-emitting elements 120 in a so-called series-parallel connection in which 24 light-emitting elements 120 are connected in series and two columns of light-emitting elements 120 are connected in parallel (in a 24 series and 2 parallel connection state). The wiring line 172 connects the light-emitting elements 130 in a so-called series parallel connection in which 24 light-emitting elements 130 are connected in series and two columns of light-emitting elements 130 are connected in parallel (in a 24 series and 2 parallel connection state).

As shown in FIG. 4B, the wiring lines 171 and 172 respectively include a plurality of bonding wires 173 and 174 and a plurality of bonding pads 175 and 176 as the structural elements. One end of each of the bonding wires 173 and 174 is connected to a corresponding one of the light-emitting elements 120 and 130, and the other end thereof is connected to one of the bonding pads 175 and 176 that is located closest to the one of the light-emitting elements 120 and 130.

The bonding pads 175 and 176 are individually disposed between adjacent pairs of light-emitting elements 120 and 130 in the light-emitting element columns, and also at the outer sides of both ends of each light-emitting element column. Note that although not shown in the figures, the bonding pads 175 or 176 at the outer sides of both ends of each light-emitting element column are electrically connected to the terminals 161 to 164.

With the electrical connection structure as described above, independent electrical systems are established to apply electric current to the light-emitting elements 120 and the light-emitting elements 130. The light-emitting elements 120 and the light-emitting elements 130 are separately subjected to lighting control by the circuit unit 4. As shown in FIG. 5, the circuit unit 4 includes a lighting circuit 4c, a dimming ratio detection circuit 4d, and a control circuit 4e. The circuit unit 4 is electrically connected to an external commercial AC power source (omitted from the drawing), and supplies electric current from the commercial AC power source to the light-emitting module 100. The lighting circuit 4c includes an AC/DC converter, converts AC voltage from the commercial AC power source into DC voltage, and applies the DC voltage to the light-emitting elements 120 and the light-emitting elements 130 based on an instruction from the control circuit 4e. The dimming ratio detection circuit 4d acquires a dimming signal containing information on a dimming ratio from the dimming unit 5. The control circuit 4e performs PWM control on the light-emitting elements 120 and the light-emitting elements 130 based on the dimming ratio. The power source may be a DC power source instead of the commercial AC power source.

(Cross-Sectional Shape of Light-Emitting Elements and Sealers)

Figure 6:
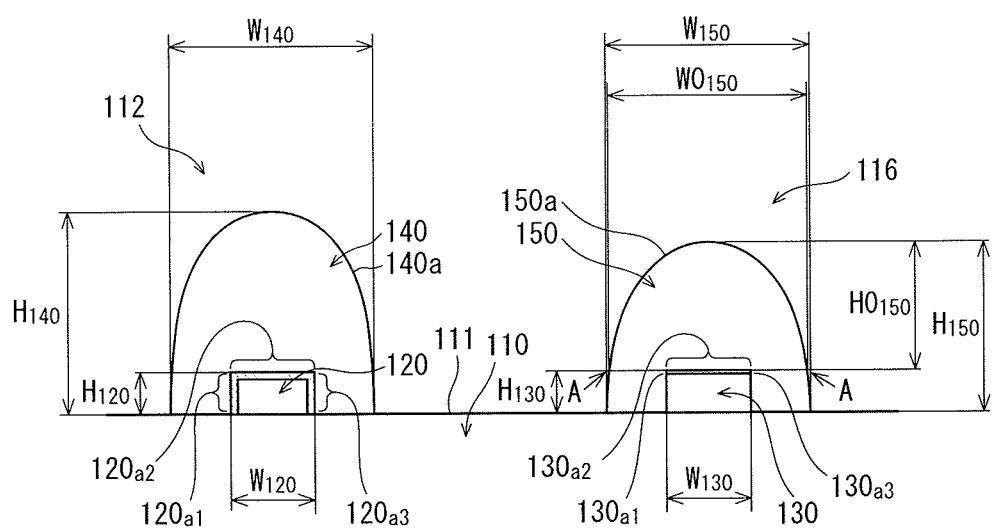
FIG. 6 is a cross-sectional view showing a cross-section along a line X-X in FIG. 4A.

FIG. 6 is a cross-sectional view showing the cross-section along the line X-X in FIG. 4A. The line X-X is a straight line passing through the center of the upper surface of the light-emitting element 120 and the center of the upper surface of the light-emitting element 130.

As described above, each light-emitting element 120 is a cuboid whose upper surface and side surfaces serve as light-emitting surfaces. Each light-emitting element 120, which has a cuboid shape composed of six surfaces, i.e., an upper surface, four side surfaces, and a bottom surface, emits light from the upper surface and the entire side surfaces thereof. Accordingly, the upper surface and the entire side surfaces serve as light-emitting regions. In FIG. 6 showing the cross-section along the line X-X, the reference sign $120_{a2}$ indicates the upper surface of the light-emitting element 120, and the reference signs $120_{a1}$ and $120_{a3}$ indicate side surfaces of the light-emitting elements 120. Also, in FIG. 6, the reference signs $H_{120}$ and $H_{130}$ indicate the heights of the light-emitting elements 120 and 130, respectively, and the reference signs $W_{120}$ and $W_{130}$ indicate the widths of the cross sections of the light-emitting elements 120 and 130, respectively.

The sealers 140, each having a dome shape, individually seal the light-emitting elements 120. In other words, in the cross section at a virtual plane along the line X-X, the sealer 140 has a substantially semi-elliptical shape. The sealers 140 sealing the respective light-emitting elements 120 have substantially the same shape. Let $W_{140}$ be the diameter of the bottom surface of the sealer 140, and $H_{140}$ be the height from the bottom surface to the top of the sealer 140. Then, the ratio between the diameter of the bottom surface of the sealer 140 and the height of the sealer 140 is defined as $H_{140}/W_{140}$, and this ratio is an aspect ratio $R_{140}$ that defines the optical characteristics of the sealer 140. In the present embodiment, the diameter $W_{140}$ of the bottom surface of each sealer 140 is 1200 µm, for example.

That is, in the vertical cross section of the sealer 140 that passes through the center of the upper surface of the light-emitting element 120 (i.e., cross section including the normal line with respect to the upper surface), the aspect ratio $R_{140}$ of the sealer 140 is defined as follows. That is, the aspect ratio $R_{140}$ is defined as the ratio of the heightwise distance from the top of the sealer 140 to the upper surface 111 of the substrate 110 with respect to the width of the sealer 140 at the upper surface 111 of the substrate 110 which is located at the lower edges of the side surfaces $120_{a1}$ and $120_{a3}$ of the light-emitting element 120, i.e., at the lower edges of the light-emitting regions.

Here, the center of the upper surface of the light-emitting element 120 coincides with the centroid of the upper surface of the light-emitting element 120. In the case of the present embodiment where the upper surface has a rectangular shape, the center of the upper surface of the light-emitting element 120 is represented as the intersection of the diagonal lines of the upper surface $120_{a2}$.

As described above, each light-emitting element 130 is a cuboid whose upper surface serves as a light-emitting surface. Each light-emitting element 130, which has a cuboid shape composed of six surfaces, i.e., an upper surface, four side surfaces, and a bottom surface, mainly emits light from the upper surface. Note that, concerning each side surface, a portion of light is emitted from a linear region surrounded by: a boundary line between the side surface and the upper surface; a horizontal line at the position approximately 20 µm below the boundary line; and a pair of boundary lines each being between the side surface and another side surface. Accordingly, the upper surface and the linear region located at the upper part of each side surface serve as light-emitting regions from which light is emitted. In FIG. 6 showing the cross-section along the line X-X, the reference sign $130_{a2}$ indicates the upper surface of the light-emitting element 130, and the reference signs $130_{a1}$ and $130_{a3}$ indicate the light-emitting regions in side surfaces of the light-emitting elements 130.

The sealers 150, each having a dome shape, individually seal the light-emitting elements 130. In other words, in the cross section at a virtual plane along the line X-X, the sealer 150 has a substantially semi-elliptical shape similarly to the case of the sealer 140 in FIG. 6. The sealers 150 sealing the respective light-emitting elements 130 have substantially the same shape. Let $W_{150}$ be the diameter of the bottom surface of the sealer 150, and $H_{150}$ be the height from the bottom surface to the top of the sealer 150. Then, the ratio between the diameter of the bottom surface of the sealer 150 and the height of the sealer 150 is defined as $H_{150}/W_{150}$.

Meanwhile, let $W0_{150}$ be the diameter of the sealer 150 at the position A of the outer surface $150a$ thereof corresponding to the position at which the light-emitting region $130_{a2}$ at the upper surface of the light-emitting element 130 is located. Also, let $H0_{150}$ be the heightwise distance from the top of the sealer 150 to the light-emitting region $130_{a2}$ at the upper surface of the light-emitting element 130. Then, the aspect ratio $R_{150}$ that defines the optical characteristics of the sealer 150 can be defined as $H0_{150}/W0_{150}$. In the present embodiment, the diameter $W0_{150}$ of the sealer 150 at the position A is 1200 µm or 2500 µm, for example.

That is, in the vertical cross section of the sealer 150 that passes through the center of the upper surface of the light-emitting element 130 (i.e., cross section including the normal line with respect to the upper surface), the aspect ratio $R_{150}$ of the sealer 150 is defined as follows. That is, the aspect ratio $R_{150}$ is defined as the ratio of the heightwise distance from the top of the sealer 150 to the light-emitting region $130_{a2}$ at the upper surface of the light-emitting element 130 with respect to the width of the sealer 150 at the position corresponding to the light-emitting region $130_{a2}$ at the upper surface of the light-emitting element 130.

Here, the center of the upper surface of the light-emitting element 130 coincides with the centroid of the upper surface of the light-emitting element 130. In the case of the present embodiment where the upper surface has a rectangular shape, the center of the upper surface of the light-emitting element 130 is represented as the intersection of the diagonal lines of the upper surface $130_{a2}$.

When this aspect ratio is greater than or equal to 0.5, each sealer at the cross section has a substantially semi-elliptical shape. This semi-elliptical shape is obtained by flattening a circle to increase its diameter in the vertical direction and thereby to create an ellipse, dividing the ellipse into a top half and a bottom half, and leaving only the top half. This makes it possible to illuminate an illumination target surface with light emitted from each light-emitting element at a light distribution angle (½ beam angle) of 120°±10°, which is desirable for the lighting device.

In the lighting device 10 according to the present embodiment, the aspect ratio $R_{140}$ is larger than the aspect ratio $R_{150}$, and is less than 1.85 times the aspect ratio $R_{150}$. It is more desirable that the ratio of the aspect ratio $R_{140}$ to the aspect ratio $R_{150}$ be in the range of at least 1.25 and at most 1.65. It is further desirable that the ratio of the aspect ratio $R_{140}$ to the aspect ratio $R_{150}$ be in the range of at least 1.5 and at most 1.65.

The sealers as described above are formed by pouring a liquid light-transmissive material onto a substrate via a nozzle, and solidifying the liquid light-transmissive material. At this time, a nozzle diameter, a liquid amount, a viscosity, etc., are controlled so that each of the sealers has the shape as described above.

(Relationship between Cross-Sectional Shape of Sealer and Color Unevenness)

The sealers 140 and 150 are made of the same type of light-transmissive materials. Accordingly, the light-transmissive materials of the respective sealers 140 and 150 have substantially the same refractive index. The light-transmissive materials of the sealers 140 and 150 have a refractive index higher than that of air. In the present description, the refractive index of air is assumed to be 1.000292 (at 0° C. and 1 atm pressure). When the lights emitted from the light-emitting elements 120 and 130 travel upward from the sealers 140 and 150 via the outer surfaces 140a and 150a, the respective lights are refracted based on the angle between the outer surface 140a and the optical axis and the angle between the outer surface 150a and the optical axis, according to Snell's law, and the refracted lights illuminate the illumination target surface at respective light distribution angles after the refraction. If the distribution of the light emitted from each of the light-emitting elements 120 and 130 is uniform at the illumination target surface, the color unevenness of the illumination light is lowered.

Aspect of Comparative Example

Figure 7A:
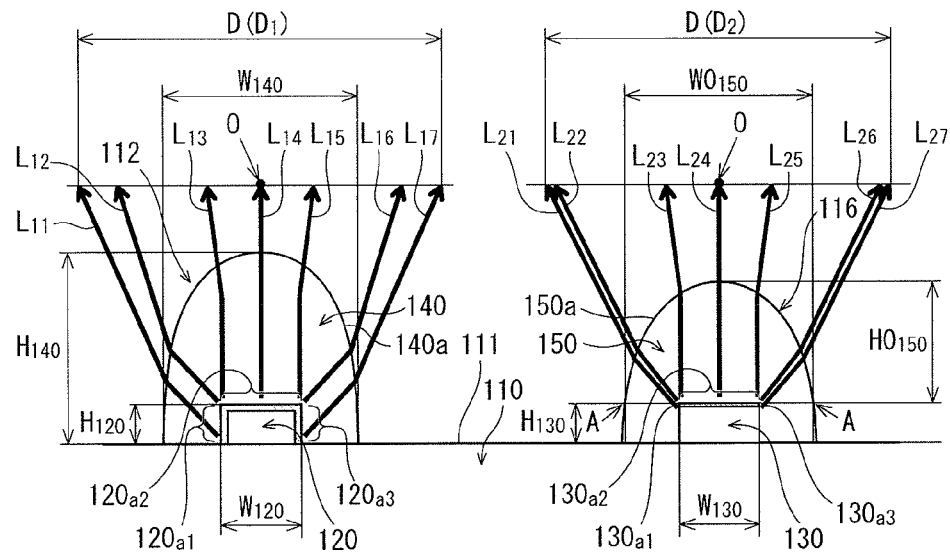
FIGS. 7A and 7B are schematic diagrams for explaining the color-mixing capability of a light-emitting module according to the embodiment, where
Figure 7B:
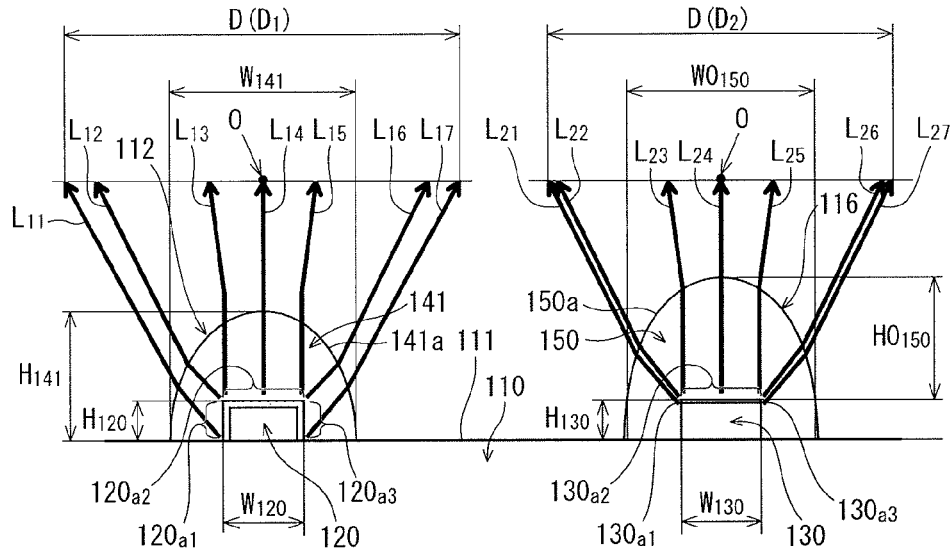

FIGS. 7A and 7B are schematic diagrams for explaining the color-mixing capability of a light-emitting module according to the present embodiment. FIG. 7A shows a manner of color mixing by a lighting device according to the present embodiment. FIG. 7B shows a manner of color mixing by a lighting device according to the comparative example.

In the lighting device according to the comparative example shown in FIG. 7B, a portion of a sealer 141 sealing a light-emitting element 120 and a portion of a sealer 150 sealing a light-emitting element 130 have the same cross-sectional shape. Specifically, the portion of the sealer 141 is a portion that serves as an optical member and is located more upward than the upper surface 111 of a substrate. The portion of the sealer 150 is a portion that serves as an optical member and is located more upward than the upper surface of the light-emitting element 130. Accordingly, letting $W_{141}$ be the diameter of the bottom surface of the sealer 141 at the upper surface of the substrate, and $W0_{150}$ be the width of the sealer 150 at the position corresponding to a light-emitting region $130_{a2}$ at the upper surface of the light-emitting element 130, $W_{141}$ equals $W0_{150}$. Also, letting $H_{141}$ be the height of the sealer 141 from the upper surface 111 of the substrate to the top of the sealer 141, and $H0_{150}$ be the heightwise distance from the top of the sealer 150 to the light-emitting region $130_{a2}$ at the upper surface of the light-emitting element 130, $H_{141}$ equals $H0_{150}$.

As shown in FIG. 7B, the light emitted from the upper surface $120_{a2}$ of the light-emitting element 120, directed immediately above (in the direction perpendicular to the upper surface 111 of the substrate 110), and passing through any of light paths $L_{13}$, $L_{14}$, and $L_{15}$ mainly passes the point in the vicinity of the top of the outer surface 141a of the sealer 141, and travels directly above or obliquely upward in a direction slightly deviating from the direction perpendicular to the upper surface 111.

Similarly, the light emitted from the upper surface $130_{a2}$ of the light-emitting element 130, directed immediately above, and passing through any of light paths $L_{23}$, $L_{24}$, and $L_{25}$ mainly passes the point in the vicinity of the top of the outer surface 150a of the sealer 150, and travels directly above or obliquely upward in a direction slightly deviating from the direction perpendicular to the upper surface 111.

Also, the light emitted from the left edge of the upper surface $120_{a2}$ of the light-emitting element 120, directed obliquely upward to the left, and passing through a light path $L_{12}$, and the light emitted from the right edge of the upper surface $120_{a2}$, directed obliquely upward to the right, and passing through a light path $L_{16}$ are each refracted when being output upward from the outer surface 141a of the sealer 141. At this time, the lights from the left and right edges of the upper surface $120_{a2}$ are refracted based on the angle between the outer surface 141a and the light path $L_{12}$ and the angle between the outer surface 141a and the light path $L_{16}$, respectively, and the illumination target surface is illuminated with the refracted lights.

Also, the light emitted from the left edge of the upper surface $130_{a2}$ of the light-emitting element 130, directed obliquely upward to the left, and passing through a light path $L_{22}$, and the light emitted from the right edge of the upper surface $130_{a2}$, directed obliquely upward to the right, and passing through a light path $L_{26}$ are each refracted when being output upward from the outer surface 150a of the sealer 150. At this time, the lights from the left and right edges of the upper surface $130_{a2}$ are refracted based on the angle between the outer surface 150a and the light path $L_{22}$ and the angle between the outer surface 150a and the light path $L_{26}$, respectively, and the illumination target surface is illuminated with the refracted lights.

As described above, the portion of the sealer 141 that serves as an optical member and is located more upward than the upper surface 111 of the substrate, and the portion of the sealer 150 that serves as an optical member and is located more upward than the upper surface of the light-emitting element 130 have the same cross-sectional shape. Accordingly, the angle between the outer surface 141a and the light path $L_{12}$ is substantially the same as the angle between the outer surface 150a and the light path $L_{22}$. Also, the light distribution angles of the light paths $L_{12}$ and $L_{22}$ after refraction are substantially the same. Furthermore, the angle between the outer surface 141a and the light path $L_{16}$ is substantially the same as the angle between the outer surface 150a and the light path $L_{26}$. Also, the light distribution angles of the light paths $L_{16}$ and $L_{26}$ after refraction are substantially the same. As a result, the lights that pass the light paths $L_{12}$ and $L_{16}$ and the lights that pass the light paths $L_{22}$ and $L_{26}$ illuminate the portions of the illumination target surface that are equidistant from the center O of an illumination region D.

On the other hand, the light emitted from the lower edge of each side surface of the light-emitting element 120 and the light emitted from the lower edge of the light-emitting region at each side surface of the light-emitting element 130 illuminate different portions of the illumination target surface.

Specifically, the light emitted from the lower edge of the light-emitting region $130_{a1}$ at a side surface of the light-emitting element 130, directed obliquely upward to the left, and passing through the light path $L_{21}$, and the light emitted from the lower edge of the light-emitting region $130_{a3}$ at another side surface of the light-emitting element 130, directed obliquely upward to the right, and passing through the light path $L_{27}$ are each refracted when being output upward from the outer surface 150a of the sealer 150. At this time, the lights from the lower edges of light-emitting regions $130_{a1}$ and $130_{a3}$ are refracted based on the angle between the outer surface 150a and the light path $L_2$ and the angle between the outer surface 150a and the light path $L_{27}$, respectively, and the periphery portion of the illumination region D of the illumination target surface is illuminated with the refracted lights. The length of each of the light-emitting regions $130_{a1}$ and $130_{a3}$ at the side surfaces is as short as approximately 20 μm. Accordingly, the light paths $L_{21}$ and $L_{22}$ have substantially the same distribution angle, and the light paths $L_{27}$ and $L_{26}$ have substantially the same angle. Accordingly, the lights that pass through the light paths $L_{21}$ and $L_{22}$ illuminate the portions of the illumination target surface that are approximately equidistant from the center O of the illumination region D. Similarly, the lights that pass through the light paths $L_{27}$ and $L_{26}$ illuminate the portions of the illumination target surface that are approximately equidistant from the center O of the illumination region D.

The light emitted from the lower edge of the side surface $120_{a1}$ of the light-emitting element 120 located at the upper surface 111 of the substrate, directed obliquely upward to the left, and passing through a light path $L_{11}$, and the light emitted from the lower edge of the side surface $120_{a3}$ located at the upper surface of the substrate, directed obliquely upward to the right, and passing through a light path $L_{17}$ are each refracted when being output from the outer surface 141a of the sealer 141. At this time, the lights from lower edges of the side surfaces $120_{a1}$ and $120_{a3}$ are refracted based on the angle between the outer surface 141a and the light path $L_1$ and the angle between the outer surface 141a and the light path $L_{17}$, respectively, and the illumination target surface is illuminated with the refracted lights. In the light-emitting element 120, the height $H_{120}$ of each of the side surfaces $120_{a1}$ and $120_{a3}$ from which light is emitted is as high as approximately 140 μm to 250 μm. Accordingly, the positions at which the light paths $L_{11}$ and $L_{17}$ intersect the outer surface 141a are located closer to the circumferential edge of the sealer 141 than the positions at which the light paths $L_{12}$ and $L_{16}$ intersect the outer surface 141a, and the light paths $L_{11}$ and $L_{17}$ have larger light distribution angles than the light paths $L_{12}$ and $L_{16}$. The light passing through the light path $L_{11}$ illuminates a portion of the illumination target surface located farther from the center O of the illumination region D than a portion of the illumination target surface illuminated by the light passing through the light path $L_{12}$. Similarly, the light passing through the light path $L_{17}$ illuminates a portion of the illumination target surface located farther from the center O of the illumination region D than a portion of the illumination target surface illuminated by the light passing through the light path $L_{16}$.

Accordingly, an illumination region $D_1$ of the illumination target surface which is illuminated by the light from the light-emitting element 120 is larger than an illumination region $D_2$ of the illumination target surface which is illuminated by the light from the light-emitting element 130. As a result, the difference occurs in the illuminance ratio of each of the light-emitting elements 120 and 130 at the central portion and peripheral portion of the illumination region D, causing color unevenness in chromaticity of illumination light at the central portion and the peripheral portion.

Aspect of Present Embodiment

In the lighting device according to the present embodiment shown in FIG. 7A, the sealer 140 has a different shape from the sealer 141 of the conventional lighting device. The sealer 150 has the same shape as the sealer of the lighting device in the comparative example. Accordingly, the illuminance distribution of the light from the light-emitting element 130 at the illumination target surface and the size of the illumination region $D_2$ are the same as in the conventional lighting device.

As described above, concerning the sealer 140, letting $W_{140}$ be the diameter of the bottom surface of the sealer 140 at the upper surface 111 of the substrate, and $H_{140}$ be the height from the bottom surface to the top of the sealer 140. Then, the ratio between the diameter of the bottom surface of the sealer 140 and the height of the sealer 140 is defined as $H_{140}/W_{140}$, and this ratio is an aspect ratio $R_{140}$ that defines the optical characteristics of the sealer 140.

Also, as described above, the following parameters can be defined as the substantive indicators indicating the optical characteristics of the sealer 150.

That is, as described above, let $W0_{150}$ be the diameter of the sealer 150 at the position A of the outer surface 150a thereof corresponding to the position at which the light-emitting region $130_{a2}$ at the upper surface of the light-emitting element 130 is located. Also, let $H0_{150}$ be the heightwise distance from the top of the sealer 150 to the light-emitting region $130_{a2}$ at the upper surface of the light-emitting element 130. Then, the aspect ratio $R_{150}$ that defines the optical characteristics of the sealer 150 can be defined as $H0_{150}/W0_{150}$.

When the light-emitting element 130 that mainly emits light from its upper surface is used, the optical characteristics of the sealer 150 in the cross section are evaluated at the portion of the sealer 150 that serves as an optical member and is located more upward than the upper surface of the light-emitting element 130. This makes it possible to accurately evaluate the optical characteristics of the sealer 150. In other words, the optical characteristics of the sealer 150 can be evaluated accurately by calculating the aspect ratio of the sealer 150 with use of the diameter of the sealer 150 at the position A corresponding to the position of the light-emitting region $130_{a2}$ at the upper surface of the light-emitting element 130, and the heightwise distance from the top of the sealer 150 to the light-emitting region $130_{a2}$ at the upper surface of the light-emitting element 130.

In the lighting device according to the present embodiment, the aspect ratio $R_{140}$ is larger than the aspect ratio $R_{150}$, and is less than 1.85 times the aspect ratio $R_{150}$. It is more desirable that the ratio of the aspect ratio $R_{140}$ to the aspect ratio $R_{150}$ be in the range of at least 1.25 and at most 1.65. It is further desirable that the ratio of the aspect ratio $R_{140}$ to the aspect ratio $R_{150}$ be in the range of at least 1.5 and at most 1.65.

As a result, the light emitted from the light-emitting element 120 passes through any of the following light paths. That is, the light emitted from the upper surface $120_{a2}$ of the light-emitting element 120, directed immediately above, and passing through any of the light paths $L_{13}$, $L_{14}$, and $L_{15}$ mainly passes the point in the vicinity of the top of the outer surface 140a of the sealer 140, and travels directly above or obliquely upward in a direction slightly deviating from the direction perpendicular to the upper surface 111. The light paths $L_{13}$, $L_{14}$, and $L_{15}$ are substantially the same as the light paths in the conventional lighting device.

On the other hand, the light emitted from the side surfaces of the light-emitting element 120 illuminates a portion of the illumination target surface that differs from the portion illuminated by the conventional lighting device. The light emitted from the lower edge of the side surface $120_{a1}$ of the light-emitting element 120 located at the upper surface 111 of the substrate, directed obliquely upward to the left, and passing through the light path $L_{11}$, and the light emitted from the lower edge of the side surface $120_{a3}$ located at the upper surface of the substrate, directed obliquely upward to the right, and passing through the light path $L_{17}$ are each refracted when being output from the outer surface 141a of the sealer 141. At this time, the lights from lower edges of the side surfaces $120_{a1}$ and $120_{a3}$ are refracted based on the angle between the outer surface 140a and the light path $L_{11}$ and the angle between the outer surface 140a and the light path $L_{17}$, respectively, and the illumination target surface is illuminated with the refracted lights.

As described above, in the light-emitting element 120, the height $H_{120}$ of each of the side surfaces $120_{a1}$ and $120_{a3}$ from which light is emitted is as large as approximately 140 μm to 250 μm. Accordingly, the light path $L_{11}$ has a larger distribution angle than the light path $L_{12}$, and the light path $L_{17}$ has a larger light distribution angle than the light path $L_{16}$.

However, in the lighting device of the present embodiment, the aspect ratio $R_{140}$ is larger than the aspect ratio $R_{150}$, and the incident angle to the outer surface 140a is larger than the incident angle to the outer surface 141a. Accordingly, as compared to the light path $L_{11}$ in the conventional lighting device, the light path $L_{11}$ in the lighting device according to the present embodiment is refracted inward to a great extent based on Snell's law. As a result, the light passing through the light path $L_{11}$ and the light emitted from the light-emitting element 130 and passing through the light path $L_{21}$ illuminate portions of the illumination region D that are equidistant from the center O of the illumination region D.

Similarly, as compared to the light path $L_{17}$ in the conventional lighting device, the light path $L_{17}$ in the lighting device according to the present embodiment is refracted inward to a great extent. As a result, the light passing through the light path $L_{17}$ and the light emitted from the light-emitting element 130 and passing through the light path $L_{27}$ illuminate portions of the illumination region D that are equidistant from the center O of the illumination region D.

Accordingly, the illumination region $D_1$ illuminated by the light from the light-emitting element 120 and the illumination region $D_2$ illuminated by the light from the light-emitting element 130 become substantially the same.

Also, the light emitted from the left edge of the upper surface $120_{a2}$ of the light-emitting element 120, directed obliquely upward to the left, and passing through the light path $L_{12}$, and the light emitted from the right edge of the upper surface $120_{a2}$, directed obliquely upward to the right, and passing through the light path $L_{16}$ are each refracted when being output upward from the outer surface 140a of the sealer 140. At this time, the lights from the left and right edges of the upper surface $120_{a2}$ are refracted based on the angle between the outer surface 140a and the light path $L_{12}$ and the angle between the outer surface 140a and the light path $L_{16}$, respectively, and the illumination target surface is illuminated with the refracted lights. As a result, as compared to the light paths $L_{12}$ and $L_{16}$ in the conventional lighting device, the light path $L_{12}$ and $L_{16}$ in the lighting device according to the present embodiment are refracted inward to a great extent, and illuminate the inner side of the periphery of the illumination region $D_1$.

As described above, in the lighting device according to the present embodiment, the illumination region $D_1$ illuminated by the light from the light-emitting element 120 is substantially the same as the illumination region D, illuminated by the light-emitting element 130. As a result, there is little difference in the illuminance ratio of each of the light-emitting elements 120 and 130 at the central portion and peripheral portion of the illumination region D, suppressing color unevenness which is found at the central portion and peripheral portion of the illumination region illuminated by the conventional lighting device.

<Evaluation Test>

Evaluation on color unevenness was performed with use of the light-emitting module 100 according to the present embodiment. The following describes the results of the evaluation.

FIG. 8 shows the outlines of light-emitting modules of embodiment examples 1 to 4 used for an optical simulation according to the present embodiment. The length of a side of a rectangular upper surface of the light-emitting element 120 is 500 μm. The length of a side of a rectangular upper surface of the light-emitting element 130 is 500 μm. Concerning the sealer 140 that seals the light-emitting element 120, the outer diameter of the sealer 140 at the position corresponding to the lower edge of the light-emitting region at each of the side surfaces $120_{a1}$ and $120_{a3}$ of the light-emitting element 120 is 1200 μm. Note that the outer diameter of the sealer 140 at the position corresponding to the lower edge of the light-emitting region of the light-emitting element 120 refers to the outer diameter of the bottom portion of the sealer 140 (at the upper surface 111 of the substrate). The outer diameter of the sealer 150 sealing the light-emitting element 130 is 1200 μm or 2500 μm. Note that the outer diameter of the sealer 150 refers to the outer diameter at the position corresponding to the light-emitting region $130_{a2}$ of the light-emitting element 130, i.e., the position corresponding to the upper surface of the light-emitting element 130 sealed by the sealer 150. The height of the light-emitting element 120 is 140 μm or 250 μm, and the height of the light-emitting element 130 is 250 μm. A ½ beam angle which indicates the light distribution angle of each light-emitting element is 120°.

While a light-emitting module using the two types of light-emitting elements and sealers as described above was lit, the chromaticity at each portion within the illumination region of the illumination target surface was calculated by an optical simulation. Then, a color difference at the central portion and the peripheral portion of the illumination region was calculated. In the optical simulation, two light-emitting elements of different types as described above were arranged on the same substrate. Then, the intensity distribution of light that reaches the light-receiving surface of a sphere, which was arranged sufficiently far from the light-emitting elements (specifically, 500 mm away from the light-emitting elements), was calculated for each angle by a ray tracing method.

Then, calculation was performed so as to obtain the ratio of the aspect ratio $R_{140}$ of the sealer 140 to the aspect ratio $R_{150}$ of the sealer 150 which keeps the difference in color between the central portion and peripheral portion of the illumination region to be within a permissible range.

Evaluation was performed under the presumption that the permissible range in color difference on the illumination surface is in the range of $\Delta x \leq 0.04$ in the CIE xy chromaticity diagram, based on the sensory evaluations by a plurality of people. This permissible range is defined as a permissible color difference range. As long as within the permissible color difference range, the color difference can be evaluated as being at a level less likely to be an obstacle in the normal use and being permissible as color unevenness of illumination light.

FIGS. 9A to 9D each show the relationship between (i) the ratio of the aspect ratio $R_{140}$ of the sealer 140 to the aspect ratio $R_{150}$ of the sealer 150 and (ii) the color difference between the central portion and peripheral portion of the illumination region, regarding the light-emitting module according to the present embodiment.

Embodiment Example 1

In Embodiment example 1, the length of a side of the rectangular upper surface of each of the light-emitting elements 120 and 130 is 500 m; the heights of the light-emitting elements 120 and 130 are 140 μm and 250 μm, respectively; the outer diameter of the sealer 140 at the upper surface 111 of the substrate is 1200 μm; and the outer diameter of the sealer 150 at the position corresponding to the light-emitting element 130 is 1200 μm.

Figure 9A:
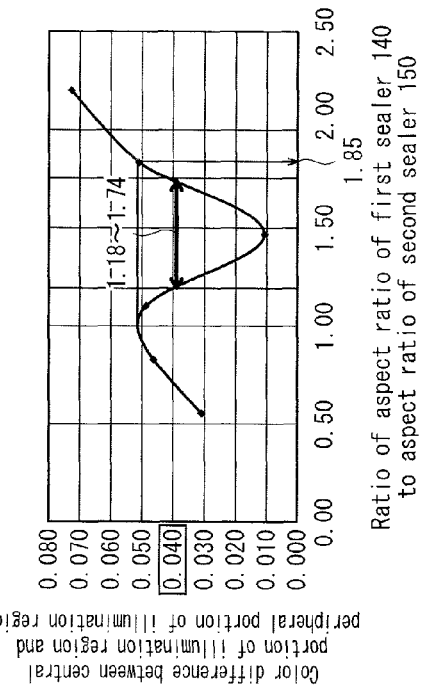
FIGS. 9A to 9D each show the relationship between (i) the ratio of the aspect ratio $R_{140}$ of a sealer 140 to the aspect ratio $R_{150}$ of a sealer 150 and (ii) the color difference between the central portion and peripheral portion of an illumination region, regarding a light-emitting module according to the embodiment, where FIG. 9A pertains to embodiment example 1, FIG. 9B pertains to embodiment example 2, FIG. 9C pertains to embodiment example 3, and FIG. 9D pertains to embodiment example 4.

As shown in FIG. 9A, in embodiment example 1, the reference point is the point at which the aspect ratio $R_{140}$ of the sealer 140 is the same as the aspect ratio $R_{150}$ of the sealer 150 (hereinafter, simply referred to as "when the aspect ratios are equal"). When the aspect ratio $R_{140}$ of the sealer 140 is larger than the aspect ratio $R_{150}$ of the sealer 150, the color difference between the central portion and peripheral portion of the illumination region (hereinafter, simply referred to as "color difference") decreases. When the ratio of the aspect ratio $R_{140}$ of the sealer 140 to the aspect ratio $R_{150}$ of the sealer 150 (hereinafter, simply referred to as "relative aspect ratio") is less than 1.85, the color difference is small as compared to the case where the aspect ratios are equal.

Furthermore, when the relative aspect ratio is at least 1.15 and at most 1.65, the color difference is within the aforementioned permissible color difference range. When the relative aspect ratio is 1.39, the color difference is at minimum. When the relative aspect ratio is at least 1.15 and less than 1.39, the light color at the peripheral portion of the illumination region changes to bluish white. On the other hand, when the relative aspect ratio is greater than 1.39 and at most 1.65, the light color at the peripheral portion of the illumination region changes to reddish white.

Embodiment Example 2

Figure 9B:
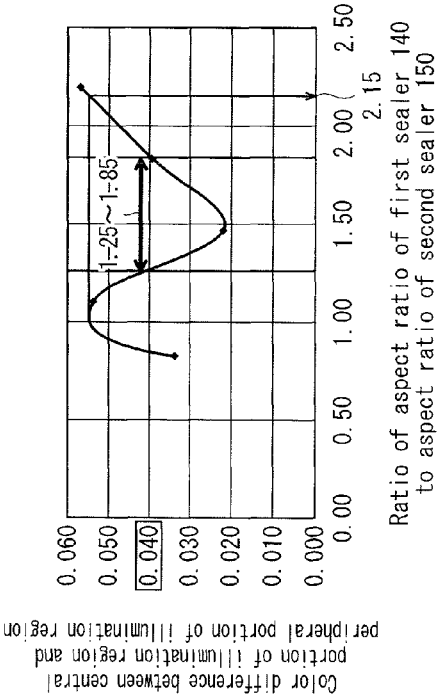

Embodiment example 2 is based on embodiment 1, where the height of the light-emitting element 120 is changed to 250 μm. As shown in FIG. 9B, in embodiment example 2, the color difference is small when the relative aspect ratio is larger than 1 and less than 1.88, as compared to when the aspect ratios are equal. Furthermore, when the relative aspect ratio is at least 1.15 and at most 1.8, the color difference is within the aforementioned permissible color difference range. When the relative aspect ratio is 1.4, the color difference is at minimum. When the relative aspect ratio is at least 1.15 and less than 1.4, the light color at the peripheral portion of the illumination area changes to bluish white. On the other hand, when the relative aspect ratio is greater than 1.4 and at most 1.65, the light color at the peripheral portion of the illumination region changes to reddish white.

Embodiment Example 3

Embodiment example 3 is based on embodiment 1, where the outer diameter of the sealer 150 at the position corresponding to the upper surface of the light-emitting element 130 is changed to 2500 μm.

Figure 9C:
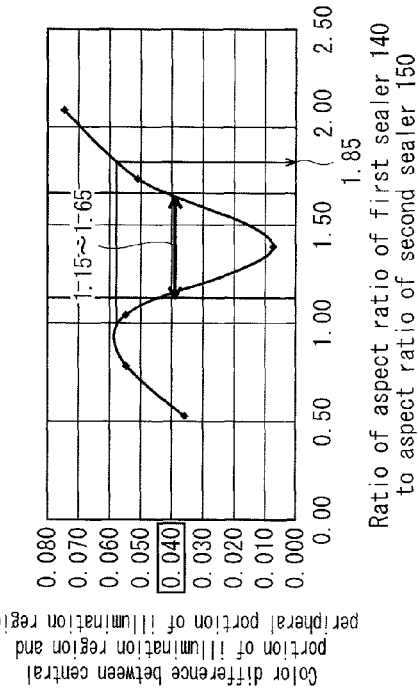

As shown in FIG. 9C, in embodiment example 3, the color difference is small when the relative aspect ratio is larger than 1 and less than 1.85, as compared to when the aspect ratios are equal. Furthermore, when the relative aspect ratio is at least 1.18 and at most 1.74, the color difference is within the aforementioned permissible color difference range. When the relative aspect ratio is 1.47, the color difference is at minimum. When the relative aspect ratio is at least 1.15 and less than 1.47, the light color at the peripheral portion of the illumination area changes to bluish white. On the other hand, when the relative aspect ratio is greater than 1.47 and at most 1.65, the light color at the peripheral portion of the illumination region changes to reddish white.

Embodiment Example 4

Figure 9D:
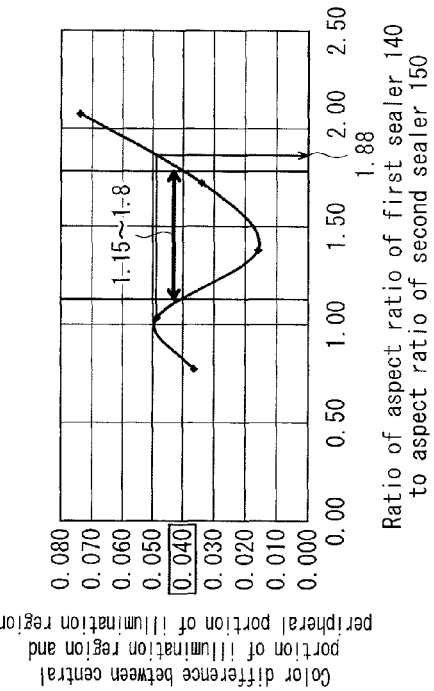

Embodiment example 4 is based on embodiment 2, where the outer diameter of the sealer 150 at the position corresponding to the upper surface of the light-emitting element 150 is changed to 2500 μm. As shown in FIG. 9D, in embodiment example 4, the color difference is small when the relative aspect ratio is larger than 1 and less than 2.15, as compared to when the aspect ratios are equal. Furthermore, when the relative aspect ratio is at least 1.25 and at most 1.85, the color difference is within the aforementioned permissible color difference range. When the relative aspect ratio is 1.5, the color difference is at minimum. When the relative aspect ratio is at least 1.15 and less than 1.5, the light color at the peripheral portion of the illumination area changes to bluish white. On the other hand, when the relative aspect ratio is greater than 1.5 and at most 1.65, the light color at the peripheral portion of the illumination region changes to reddish white.

SUMMARY

Based on the results above, in the light-emitting module according to the present embodiment, the color difference is small when the relative aspect ratio greater than 1 and less than 1.85, as compared to when the aspect ratios are equal.

Also, when the relative aspect ratio is at least 1.25 and at most 1.65, the color difference is within the aforementioned permissible color difference range.

Furthermore, based on the results above, when the relative aspect ratio is greater than 1.5 and at most 1.65, the light color at the peripheral portion of the illumination region changes to reddish white. On the other hand, when the relative aspect ratio is at least 1.15 and less than 1.39, the light color at the peripheral portion of the illumination area changes to bluish white.

Provided that changes in color occur at the same magnitude of color difference, human eyes are known to be more sensitive to a color change with a change in hue than to a color change with no change in hue. Accordingly, it is not desirable for an illuminating light source to change its color with a change in hue between reddish white and bluish white. In view of the above, it is more desirable for the illuminating light source to either change from white to bluish white or from white to reddish white, even within the permissible color difference range.

Accordingly, the relative aspect ratio is set to at least 1.5 and at most 1.65. In this way, changes in light color at the peripheral portion of the illumination region are suppressed within the range of white to reddish white. This makes it possible to realize an illuminating light source whose changes in color are perceived to be small to human eyes within the range of white having an average color temperature to white having a low color temperature.

On the other hand, when the relative aspect ratio is set to at least 1.15 and less than 1.39, changes in light color at the peripheral portion of the illumination region are suppressed within the range of white to bluish white. This makes it possible to realize an illuminating light source whose changes in color are perceived to be small to human eyes within the range of white having an average color temperature to white having a high color temperature.

EFFECT

As described above, the light-emitting module 100 according to the present embodiment has the following structure. That is, the light-emitting module 100 includes: a substrate 110; a first light-emitting element 120 and a second light-emitting element 130 that are each provided on an upper surface 111 of the substrate and each emit light having a different peak wavelength; a first sealer 140 that covers the first light-emitting element 120 and includes a light-transmissive material; and a second sealer 150 that covers the second light-emitting element 130 and includes the same type of material as the light-transmissive material. The first light-emitting element 120 emits light from an upper surface $120_{a2}$ and side surfaces $120_{a1}$ and $120_{a3}$ thereof, and the second light-emitting element 130 mainly emits light from an upper surface $130_{a2}$ thereof. In a vertical cross section of the first sealer 140 that passes through a center of the upper surface $120_{a2}$ of the first light-emitting element 120, a first ratio $R_{140}$ is defined as a ratio of a heightwise distance from a top of the first sealer 140 to the upper surface 111 of the substrate with respect to a width $W_{140}$ of the first sealer 140 at the upper surface 111 of the substrate (corresponding to the bottom portion of the sealer 140 having a dome shape). In a vertical cross section of the second sealer 150 that passes through a center of the upper surface $130_{a2}$ of the second light-emitting element 130, a second ratio $R_{150}$ is defined as a ratio of a heightwise distance $H0_{150}$ from a top of the second sealer 150 to a light-emitting region $130_{a2}$ at the upper surface of the second light-emitting element 130 with respect to a width $W0_{150}$ of the second sealer 150 at a position A corresponding to the light-emitting region $130_{a2}$ at the upper surface of the second light-emitting element 130. In this case, the first ratio $R_{140}$ is larger than the second ratio $R_{150}$, and a ratio of the first ratio $R_{140}$ to the second ratio $R_{150}$ is less than 1.85.

With the above structure, the illumination regions illuminated with the lights of light sources of different emission colors, such as an illumination region illuminated with the light of a light-emitting element as a white light source and an illumination region illuminated with a red light-emitting element, can be substantially the same. Also, with the above structure, there is little difference in the illuminance ratio of each of the light sources at the central portion and peripheral portion of the illumination region on the illumination target surface. This suppresses color unevenness which is found at the central portion and peripheral portion of the illumination region illuminated by a conventional lighting device.

<<Modifications>>

The following describes modifications of the light-emitting module, lighting device, and lighting apparatus according to aspects of the present disclosure. In the following description, the same members as those described above are provided with the same reference signs, and the description thereof is either simplified or omitted.

<Light-Emitting Module>

The light-emitting module according to one aspect of the present disclosure is not limited to the light-emitting module 100 according to the above embodiment. The following describes modifications of the light-emitting module according to one aspect of the present disclosure.

For example, in the light-emitting module 100 according to the above embodiment, each light-emitting element 120 has, for example, a cuboid shape having a rectangular upper surface of 500 µm×500 µm or 250 µm×250 µm and a height of 140 µm to 250 µm. Also, each light-emitting element 130 has a cuboid shape having a rectangular upper surface of 500 µm×500 µm and a height of 140 µm to 250 µm. However, the light-emitting elements 120 and 130 are not limited to having such structures, and the structures of the light-emitting elements 120 and 130 may be changed appropriately. For example, the height of each light-emitting element 130 may be at least 100 µm and at most 150 µm. In this way, the lower edges of the light-emitting regions at the side surfaces of the light-emitting element 130 can be positioned closer to the upper surface 111 of the substrate 110. This reduces the difference in optical characteristics between the light-emitting elements 130 and the light-emitting elements 120. This results in the difference in the illuminance ratio of each of the light sources at the central portion and peripheral portion of the illumination region on the illumination target surface being easily reduced, and the color unevenness in illumination light at the central portion and peripheral portion of the illumination region being easily reduced.

In the light-emitting module 100 according to the above embodiment, the light-emitting elements 120 and 130 are LEDs. However, the light-emitting elements according to one aspect of the present disclosure may be laser diodes (LDs) or electroluminescence elements (EL elements), or the like. The light-emitting elements according to one aspect of the present disclosure are not limited to being mounted face-up on the substrate by COB technology, and may be of the surface mount device (SMD) type.

The light-emitting module 100 according to the above embodiment includes 48 light-emitting elements 120 and 48 light-emitting elements 130. However, the number of first light-emitting elements and the number of second light-emitting elements according to one aspect of the present disclosure may be arbitrarily determined. For example, the number of first light-emitting elements and the number of second light-emitting elements may each be 1 or any plural number other than 48. The number of first light-emitting elements does not need to be the same as the number of second light-emitting elements. The light-emitting module 100 may include an additional light-emitting element other than the first light-emitting elements and the second light-emitting elements.

Also, the first light-emitting elements according to the above embodiment may be any light-emitting elements as long as they emit light having a different peak wavelength from the second light-emitting elements. For example, it suffices for the first light-emitting elements to emit light having a peak wavelength within the convertible wavelength range that allows the wavelength converters to perform wavelength conversion, and the first light-emitting elements may not be the light-emitting elements that emit blue light having a peak wavelength of at least 440 nm and at most 470 nm. For example, the first light-emitting elements may be blue light-emitting elements that emit blue light other than the blue light having a peak wavelength of at least 440 nm and at most 470 nm.

Also, the second light-emitting elements according to the above embodiment may be any light-emitting elements as long as they emit light having a different peak wavelength from the first light-emitting elements. For example, it suffices for the second light-emitting elements to emit light having a peak wavelength not within the convertible wavelength range that allows the wavelength converters to perform wavelength conversion, and the second light-emitting elements may not be the light-emitting elements that emit red light having a peak wavelength of at least 600 nm and at most 660 nm. For example, the second light-emitting elements may be red light-emitting elements that emit red light other than the red light having a peak wavelength of at least 600 nm and at most 660 nm.

The wavelength conversion material according to the above embodiment may be any of the phosphors shown below depending on the excitation light emitted from the light emitting elements.

Suitable examples of yellow phosphors include: silicate phosphors such as $(Sr,Ba)_2SiO_4:Eu^{2+}$, and $Sr_3SiO_5:Eu^{2+}$; garnet phosphors such as $(Y,Gd)_3Al_5O_{12}:Ce^{3+}$, $Y_3Al_5O_{12}:Ce^{3+}$, $Y_3Al_5O_{12}:Ce^{3+}, Pr^{3+}$, and $Tb_3Al_5O_{12}:Ce^{3+}$; thiogallate phosphor which is sulfide phosphor, such as $CaGa_2S_4:Eu^{2+}$; α-sialon phosphors, such as Ca-α-SiAlON:$Eu^{2+}$, (0.75 $(Ca_{0.9}Eu_{0.1})O.2.25AlN.3.25Si_3N_4:Eu^{2+}$, $Ca_{1.5}Al_{13}Si_9N_{16}:Eu^{2+}$ or the like), oxynitride phosphor, such as $Ba_3Si_6O_{12}N_2:Eu^{2+}$, nitride phosphor, such as $(Ca,Sr,Ba)AlSiN_3:Eu^{2+}$.

In the light-emitting module 100 according to the above embodiment, the light-emitting element columns 112 to 115 and the light-emitting element columns 116 to 119 have a strip-like shape in plan view. However, the light-emitting element columns may have a shape other than a strip-like shape as long as the first and second light-emitting elements can be mounted on the substrate.

(Modification 1)

In the light-emitting module 100 according to the above embodiment, the sealers 140 and 150 have the following structure, for example. That is, each of the sealers 140 and 150 has a dome shape and is substantially circular in plan view. The diameter of the bottom surface of each of the sealers 140 and 150 is approximately 1 mm to 3 mm. The sealers 140 and 150 seal the light-emitting elements 120 and 130 individually. However, instead of sealing the light-emitting elements 120 and 130 individually, each of the sealers 140 and 150 may continuously seal a plurality of light-emitting elements 120 or a plurality of light-emitting elements 130.

Figure 10A:
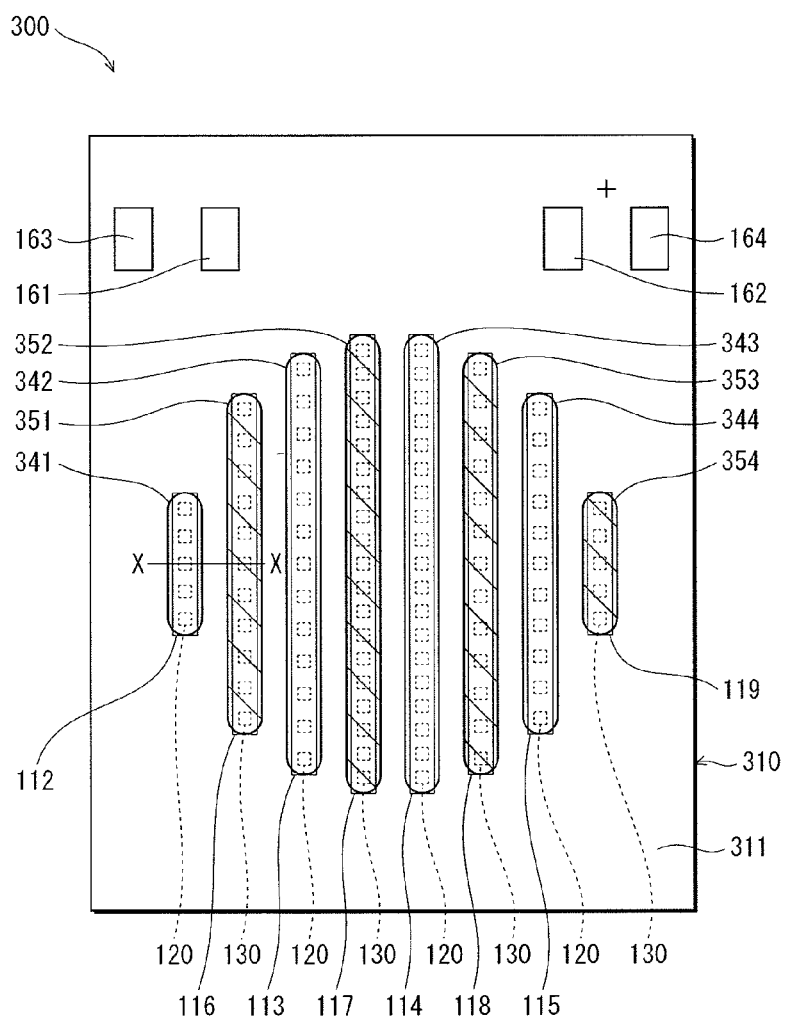
FIG. 10A to FIG. 10C each show a light-emitting module according to Modification 1, where
Figure 10B:
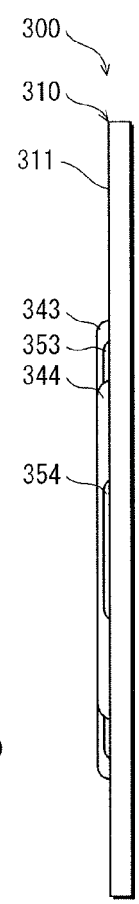
Figure 10C:
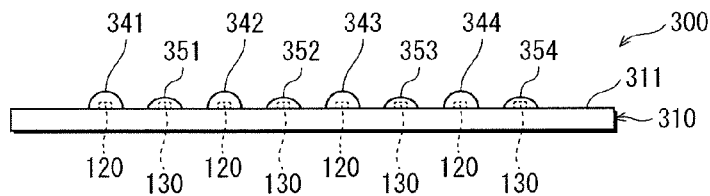
Figure 11:
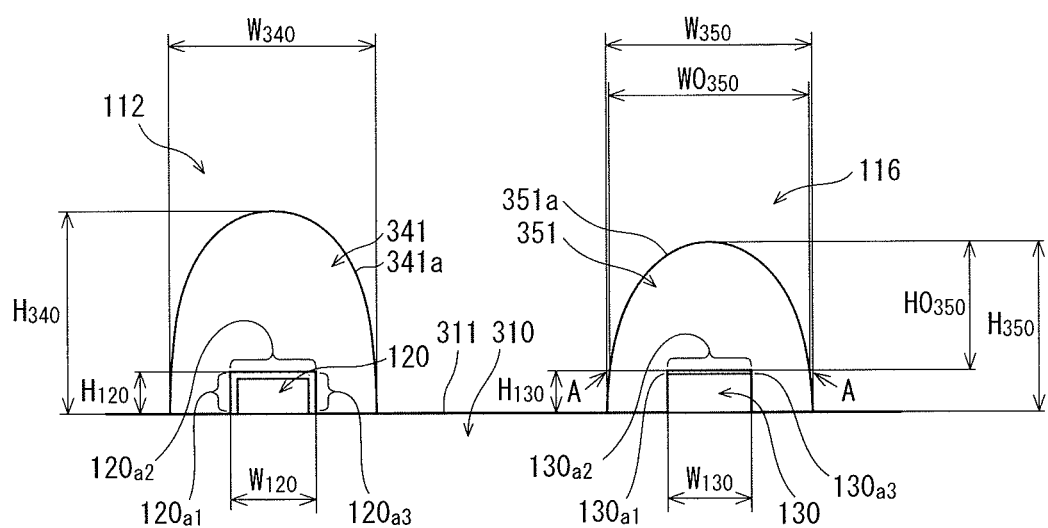
FIG. 11 is a cross-sectional view showing a cross-section along a line X-X in FIG. 10A.

FIG. 10A to FIG. 10C each show a light-emitting module according to Modification 1. FIG. 10A is a plan view, FIG. 10B is a right side view, and FIG. 10C is a front view. FIG. 11 is a cross-sectional view showing the cross-section along the line X-X in FIG. 10A. As shown in FIGS. 10A to 10C and FIG. 11, in a light-emitting module 300 according to Modification 1, four light-emitting element columns, i.e., light-emitting element columns 112 to 115, are arranged in the same manner as in the above embodiment. Each of the light-emitting element columns 112 to 115 is composed of a plurality of light-emitting elements 120. Also, four light-emitting element columns, i.e., light-emitting element columns 116 to 119, each being composed of a plurality of light-emitting elements 130, are arranged. The light-emitting element columns 112 to 115 and the light-emitting element columns 116 to 119 are arranged substantially parallel to each other at equal intervals, and the longitudinal axis of each of the light-emitting element columns 112 to 115 and 116 to 119 is oriented in the same direction.

First sealers 341 to 344 (hereinafter, simply referred to as "sealers 341 to 344") each have an elongated shape and continuously cover a plurality of light-emitting elements 120 included in a corresponding light-emitting element column from among the light-emitting element columns 112 to 115. Similarly, second sealers 351 to 354 (hereinafter, simply referred to as "sealers 351 to 354") each have an elongated shape and continuously cover a plurality of light-emitting elements 130 included in a corresponding light-emitting element column from among the light-emitting element columns 116 to 119.

The light-transmissive materials of the sealers 341 to 344 and the sealers 351 to 354 are the same as the light-transmissive materials of the sealers 140 and 150. The light-transmissive material of the sealers 341 to 344 includes a wavelength conversion material, similarly to the case of the above embodiment, and the sealers 341 to 344 serve as wavelength converters for converting light color.

(Cross-Sectional Shape of Light-Emitting Elements and Sealers)

FIG. 11 is a cross-sectional view showing the cross-section along the line X-X in FIG. 10A. The line X-X is a straight line that passes through the center of the upper surface of the light-emitting element 120 and the center of the upper surface of the light-emitting element 130, and that is perpendicular to the column-wise direction of the light-emitting element columns 112 and 116.

The light-emitting elements 120 and 130 have the same structure as described in the above embodiment, and description thereof is thus omitted.

The cross-section of the sealer 341 has a semi-elliptical shape in the cross section along the line X-X that is perpendicular to the column-wise direction of the light-emitting element column 112. In the column-wise direction of the light-emitting element column 112, the sealer 341 has the same shape in cross sections, each of which passes through the center of the upper surface of a corresponding one of the light-emitting elements 120 and is parallel to the line X-X. Also, the sealers 341 to 344 sealing the light-emitting element columns 112 to 115 have the same shape in cross sections, each of which passes through the center of the upper surface of a corresponding one of the light-emitting elements 120 and is parallel to the line X-X.

The cross-section of the sealer 351 has a semi-elliptical shape in the cross section along the line X-X that is perpendicular to the column-wise direction of the light-emitting element column 116. In the column-wise direction of the light-emitting element column 116, the sealer 351 has the same shape in cross sections, each of which passes through the center of the upper surface of a corresponding one of the light-emitting elements 130 and is parallel to the line X-X. Also, the sealers 351 to 354 sealing the light-emitting element columns 116 to 119 have the same shape in cross sections, each of which passes through the center of the upper surface of a corresponding one of the light-emitting elements 130 and is parallel to the line X-X.

The sealers as described above are formed by pouring a liquid light-transmissive material onto a substrate via a nozzle which moves along the light-emitting element columns, and solidifying the liquid light-transmissive material. At this time, a nozzle diameter, a liquid amount, a nozzle movement speed, a viscosity, etc., are controlled so that each of the sealers has the shape as described above.

In FIG. 11, let $W_{340}$ be the width of the bottom of the sealer 341 which is located at the upper surface 311 of the substrate, and $H_{340}$ be the height from the top surface 311 of the substrate to the top of the sealer 341. Then, the ratio between the width of the bottom surface of the sealer 341 and the height of the sealer 341 is defined as $H_{340}/W_{340}$, and this ratio is an aspect ratio $R_{340}$ that defines the optical characteristics of the sealer 341.

Also, let $W_{350}$ be the width of the bottom surface of the sealer 351, and $H_{350}$ be the height of the sealer 351 from the bottom surface to the top of the sealer 351. Then, the ratio between the width of the bottom surface of the sealer 351 and the height of the sealer 351 is defined as $H_{350}/W_{350}$.

Meanwhile, let $W0_{350}$ be the width of the sealer 351 at the position A of the outer surface 351a thereof corresponding to the position at which the light-emitting region $130_{a2}$ at the upper surface of the light-emitting element 130 is located. Also, let $H0_{350}$ be the heightwise distance from the top of the sealer 351 to the light-emitting region $130_{a2}$ at the upper surface of the light-emitting element 130. Then, the aspect ratio $R_{350}$ that defines the optical characteristics of the sealer 351 can be defined as $H0_{350}/W0_{350}$.

In the light-emitting module according to Modification 1, the aspect ratio $R_{340}$ is larger than the aspect ratio $R_{350}$, and is less than 1.85 times the aspect ratio $R_{350}$. It is more desirable that the ratio of the aspect ratio $R_{340}$ to the aspect ratio $R_{350}$ be in the range of at least 1.25 and at most 1.65. It is further desirable that the ratio of the aspect ratio $R_{340}$ to the aspect ratio $R_{350}$ be in the range of at least 1.5 and at most 1.65.

In this way, the illumination region illuminated by the light from each of the light-emitting elements 120 is substantially the same as the illumination region illuminated by the light from each of the light-emitting elements 130, similarly to the case of the above embodiment. As a result, there is little difference in the illuminance ratio of each of the light-emitting elements 120 and 130 at the central portion and peripheral portion of the illumination region, suppressing color unevenness which is found at the central portion and peripheral portion of the illumination region in the conventional lighting device.

(Modification 2)

Figure 12A:
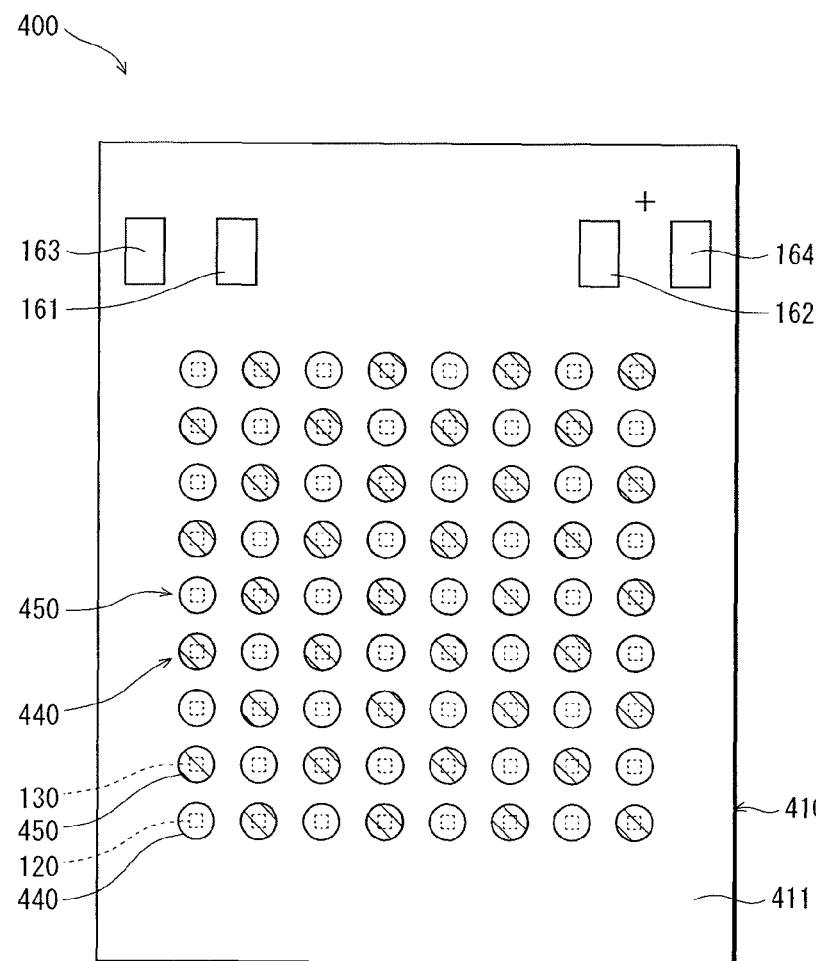
FIG. 12A to FIG. 12C each show a light-emitting module according to Modification 2, where
Figure 12B:
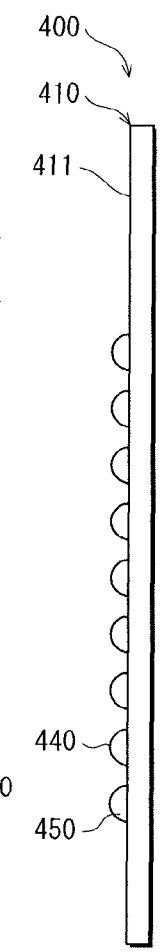
Figure 12C:
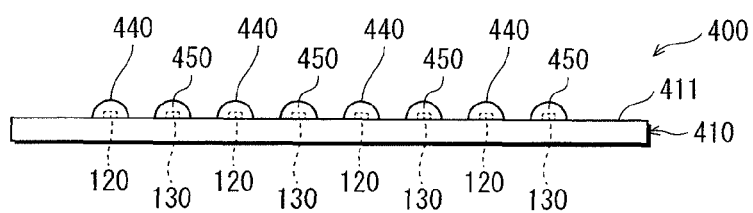

FIG. 12A to FIG. 12C show a light-emitting module according to Modification 2. FIG. 12A is a plan view, FIG. 12B is a right side view, and FIG. 10C is a frontal view.

As shown in FIGS. 12A to 12 C, a light-emitting module 400 according to Modification 2 is similar to the light-emitting module 100 according to the above embodiment, in that sealers have a dome shape, are substantially circular in plan view, and seal the light-emitting elements 120 and 130 individually. In the light-emitting module 400 according to Modification 2, however, the light-emitting elements 120 and the light-emitting elements 130 are alternately mounted on the upper surface 411 of the substrate 410 in a staggered arrangement.

The sealers include a plurality of first sealers 440 and a plurality of second sealers 450 (hereinafter, simply referred to as "sealers 440" and "sealers 450") that seal the light-emitting elements 120 and 130 individually. The sealers 440 and 450 have a dome shape and are substantially circular in plan view, for example. The diameter of the bottom surface of each of the sealers 440 and 450 is approximately 1 mm to 3 mm. Note that the sealers 440 and 450 may not necessarily have a dome shape, and may substantially have a hemispherical shape.

The light-transmissive materials of the sealers 440 and 450 are the same as the light-transmissive materials of the sealers 140 and 150 in the above embodiment. The light-transmissive material of the sealers 440 includes a wavelength conversion material, similarly to the case of the above embodiment, and the sealers 440 serve as wavelength converters for converting light color.

In a lighting device according to Modification 2, the aspect ratio of each of the sealers 440 and 450 is defined in the same manner as in the case of the sealers 140 and 150 in the above embodiment.

That is, let $W_{440}$ be the diameter of the bottom surface of the sealer 440 which is located at the upper surface 411 of the substrate, and $H_{440}$ be the height from the top surface 411 of the substrate to the top of the sealer 441. Then, the ratio between the diameter of the bottom surface of the sealer 440 and the height of the sealer 440 is defined as $H_{440}/W_{440}$, and this ratio is an aspect ratio $R_{440}$ that defines the optical characteristics of the sealer 440.

Also, let $W0_{450}$ be the diameter of the sealer 450 at the position of the outer surface thereof corresponding to the position at which the light-emitting region $130_{a2}$ at the upper surface of the light-emitting element 130 is located. Also, let $H0_{450}$ be the heightwise distance from the top of the sealer 450 to the light-emitting region $130_{a2}$ at the upper surface of the light-emitting element 130. Then, the aspect ratio $R_{450}$ that defines the optical characteristics of the sealer 450 can be defined as $H0_{450}/W0_{450}$.

In the light-emitting module according to Modification 2, the aspect ratio $R_{440}$ is larger than the aspect ratio $R_{450}$, and is less than 1.85 times the aspect ratio $R_{450}$. It is more desirable that the ratio of the aspect ratio $R_{440}$ to the aspect ratio $R_{450}$ be in the range of at least 1.25 and at most 1.65. It is further desirable that the ratio of the aspect ratio $R_{440}$ to the aspect ratio $R_{450}$ be in the range of at least 1.5 and at most 1.65.

In this way, the illumination region illuminated by the light from each of the light-emitting elements 120 is substantially the same as the illumination region illuminated by the light from each of the light-emitting elements 130, similarly to the case of the above embodiment. As a result, there is little difference in the illuminance ratio of each of the light-emitting elements 120 and 130 at the central portion and peripheral portion of the illumination region, suppressing color unevenness which is found at the central portion and peripheral portion of the illumination region in the conventional lighting device.

<Lighting Device>

The lighting device according to one aspect of the present disclosure is not limited to the lighting device 10 according to the above embodiment. For example, although the lighting device according to the above embodiment is applied to a lamp unit for a downlight, this is not essential for the lighting device according to the above embodiment. For example, the lighting device may be applied to a straight-tube LED lamp and an LED bulb described below that are expected as alternatives to straight-tube fluorescent lamps. The straight-tube LED lamp mentioned above refers to an LED lamp that has substantially the same shape as a conventional general straight-tube fluorescent lamp using electrode coils. The LED bulb mentioned above refers to an LED lamp that has substantially the same shape as a conventional incandescent lamp.

(Modification 3)

Figure 13:
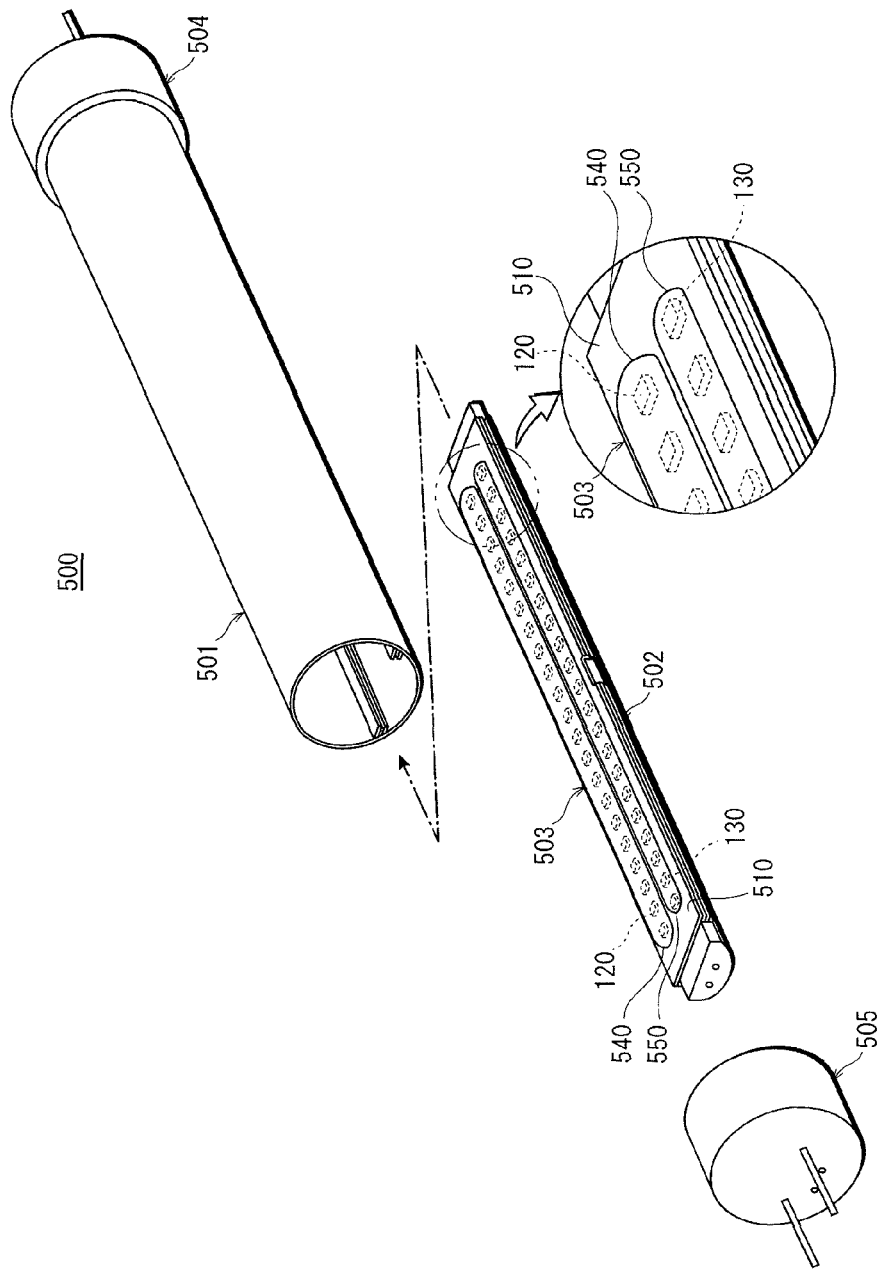
FIG. 13 is a perspective view showing a lighting device according to Modification 3.

FIG. 13 is a perspective view showing a lighting device according to Modification 3. As shown in FIG. 13, a lighting device 500 includes a housing 501 having an elongated cylindrical shape, a mount 502 disposed within the housing 501, a light-emitting module 503 mounted on the mount 502, and a pair of bases 504 and 505 attached to both ends of the housing 501.

The housing 501 has an elongated cylindrical shape with openings provided at both ends. The mount 502 and the light-emitting module 503 are housed within the housing 501. Although the material of the housing 501 is not particularly limited, a light-transmissive material is preferable. Examples of the light-transmissive material include resin such as plastic, glass, or the like. The cross-sectional shape of the housing 501 is not particularly limited, and may be annular or polygonal.

The mount 502 has an elongated plate-like shape, and the ends thereof respectively extend to areas near the pair of bases 504 and 505. The mount 502 has the same length as the housing 501 in the longitudinal direction. It is desirable that the mount 502 serve as a heat sink for dissipating heat generated by the light-emitting module 503. For this purpose, it is desirable that the mount 502 be made of a material having a high thermal conductivity such as metal.

The light-emitting module 503 includes a substrate 510, a plurality of light-emitting elements 120 and a plurality of light-emitting elements 130 mounted on the upper surface of the substrate 510, a first sealer 540 sealing the light-emitting elements 120, and a second sealer 550 sealing the light-emitting elements 130 (hereinafter, the first sealer 540 and the second sealer 550 are simply referred to as "sealer 540" and "sealer 550"). The light-emitting elements 120 and the light-emitting elements 130 are arranged so as to form linear light-emitting element columns along the longitudinal direction of the mount 502. The light-emitting element column constituted of the light-emitting elements 120 and the light-emitting element column constituted of the light-emitting elements 130 are respectively sealed by the sealers 540 and 550. The sealers 540 and 550 each have an elongated shape along the longitudinal direction of the mount 502 and are arranged in parallel at equal intervals. The light-transmissive materials of the sealers 540 and 550 are the same as the light-transmissive materials of the sealers 140 and 150 in the above embodiment. The light-transmissive material of the sealer 540 includes a wavelength conversion material.

In the lighting device according to Modification 3, the aspect ratio of each of the sealers 540 and 550 in the cross section thereof in the direction perpendicular to the longitudinal direction is defined in the same manner as in the case of the sealers 140 and 150 in the above embodiment.

In the lighting device according to Modification 3, the aspect ratio $R_{540}$ is larger than the aspect ratio $R_{550}$, and is within the range of less than 1.85. It is more desirable that the ratio of the aspect ratio $R_{540}$ to the aspect ratio $R_{550}$ be in the range of at least 1.25 and at most 1.65. It is further desirable that the ratio of the aspect ratio $R_{540}$ to the aspect ratio $R_{550}$ be in the range of at least 1.5 and at most 1.65.

In this way, the illumination region illuminated by the light from each of the light-emitting elements 120 is substantially the same as the illumination region illuminated by the light from each of the light-emitting elements 130, similarly to the case of the above embodiment. As a result, there is little difference in the illuminance ratio of each of the light-emitting elements 120 and 130 at the central portion and peripheral portion of the illumination region, suppressing color unevenness which is found at the central portion and peripheral portion of the illumination region in the conventional lighting device.

The pair of bases 504 and 505 are each attached to a socket of a lighting apparatus (omitted from the drawing). Under the condition that the lighting device 500 is attached to the lighting apparatus, electric power is applied to the light-emitting module 503 via the pair of bases 504 and 505. Heat generated by the light-emitting module 503 is conducted to the lighting apparatus via the mount 502 and the pair of bases 504 and 505.

(Modification 4)

Figure 14:
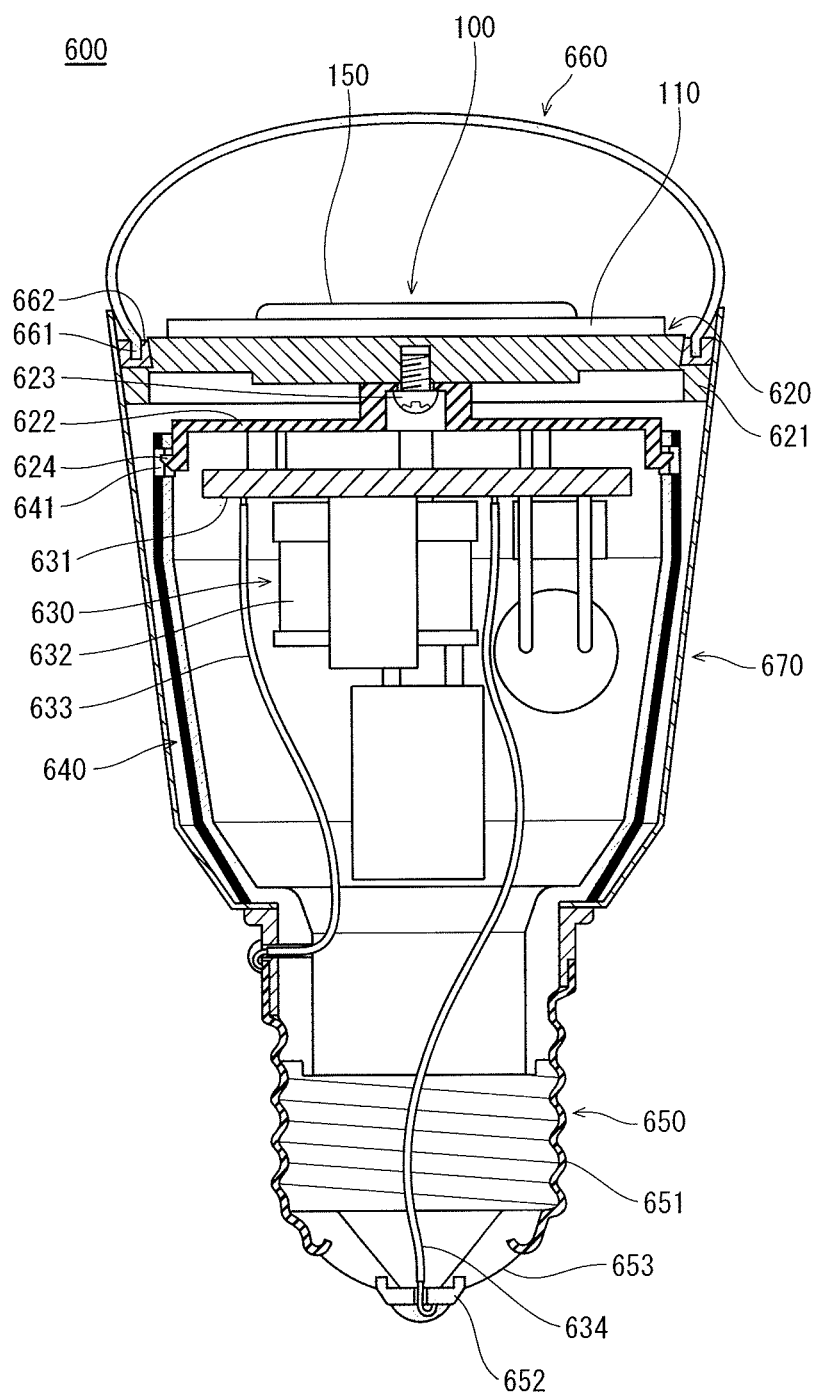
FIG. 14 is a cross-sectional view showing a lighting device according to Modification 4.

FIG. 14 is a cross-sectional view showing a lighting device according to Modification 4. As shown in FIG. 14, a lighting device 600 according to Modification 4 is an LED bulb mainly including a light-emitting module 100, a holder 620, a circuit unit 630, a circuit case 640, a base 650, a globe 660, and a housing 670.

The light-emitting module 100 is the same as the light-emitting module 100 according to the above embodiment.

The holder 620 includes a module holding part 621 and a circuit holding part 622. The module holding part 621 is a substantially disc-like part for attaching the light-emitting module 100 to the housing 670. The module holding part 621 is made of material having a high thermal conductivity such as aluminum. Owing to its material properties, the module holding part 621 serves as a heat conductor for conducting heat generated by the light-emitting module 100 to the housing 670. The circuit holding part 622 is a substantially disc-like part that is made, for example, of synthetic resin. The circuit holding part 622 is fixed to the module holding part 621 by a screw 623. The circuit holding part 622 has an engaging claw 624, which is provided at the periphery thereof and engages with the circuit case 640.

The circuit unit 630 includes a circuit board 631 and a plurality of electronic components 632 mounted on the circuit board 631. The circuit unit 630 is housed within the housing 670, with the circuit board 631 thereof being fixed to the circuit holding part 622. The circuit unit 630 is electrically connected to the light-emitting module 100. The circuit unit 630 is equivalent to the circuit unit 4 according to the above embodiment.

The circuit case 640 is attached to the circuit holding part 622, with the circuit unit 630 being housed therein. The circuit case 640 has an engaging hole 641 for engagement with the engaging claw 624 of the circuit holding part 622. The circuit case 640 is fixed to the circuit holding part 622 by engagement of the engaging claw 624 with the engaging hole 641.

The base 650 is of a type defined by Japanese Industrial Standard (JIS), such as of the E-type, and is used as an attachment to a socket (omitted from the drawing) of a common incandescent lamp. The base 650 includes a shell 651, which is also referred to as a cylindrical barrel, and an eyelet 652 having a disc-like shape. The base 650 is attached to the circuit case 640. The shell 651 and the eyelet 652 are integrated in one piece, with an insulating part 653 made of glass being interposed therebetween. The shell 651 is electrically connected to a power feed line 633 of the circuit unit 630, and the eyelet 652 is electrically connected to a power feed line 634 of the circuit unit 630.

The globe 660 is substantially dome-shaped, and the edge 661 of the opening thereof is fixed to the housing 670 and the module holding part 621 by adhesive 662 such that the globe 660 covers the light-emitting module 100.

The housing 670 is, for example, cylindrical. The light-emitting module 100 is located closer to one of the openings of the housing 670, and the base 650 is located closer to the other one of the openings of the housing 670. The base material of the housing 670 has a high thermal conductivity such as aluminum, so that the housing 670 serves as a heat dissipating member (heat sink) for dissipating heat generated by the light-emitting module 100.

(Modification 5)

Figure 15:
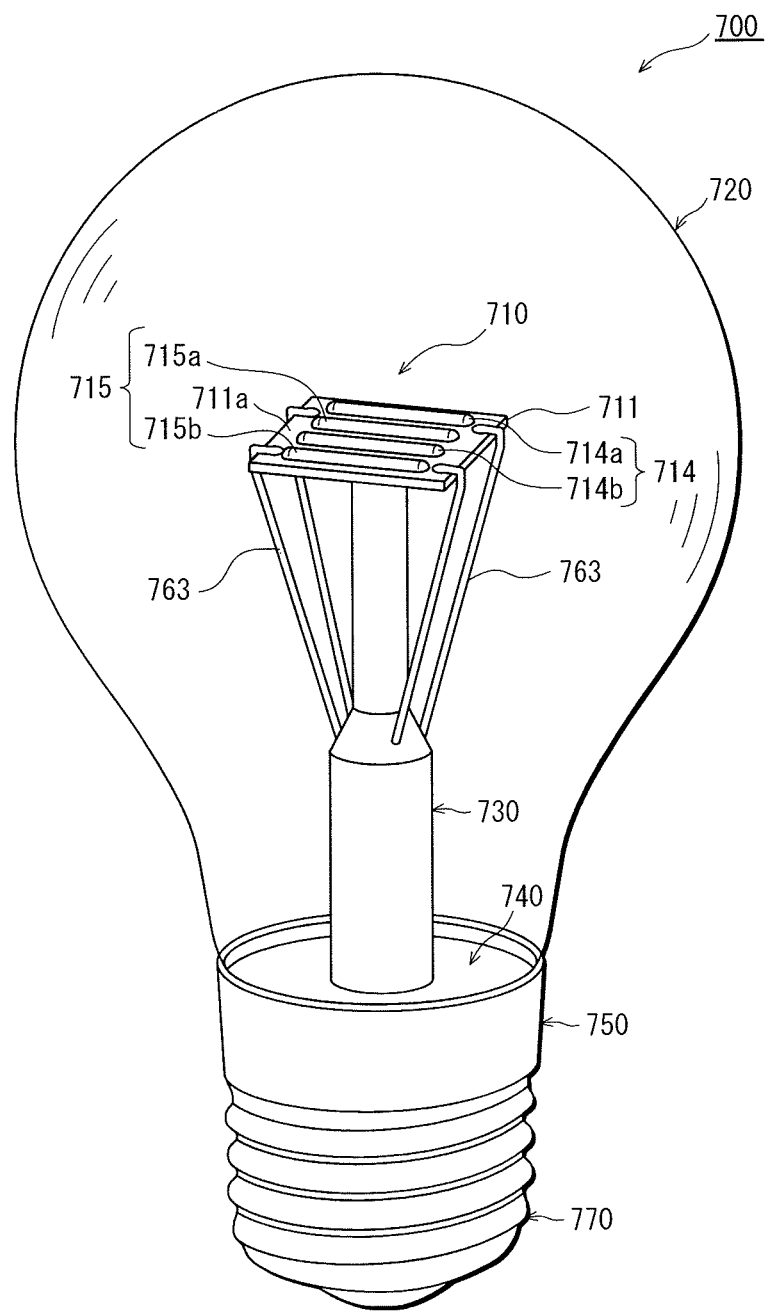
FIG. 15 is a perspective view showing a lighting device according to Modification 5.
Figure 16:
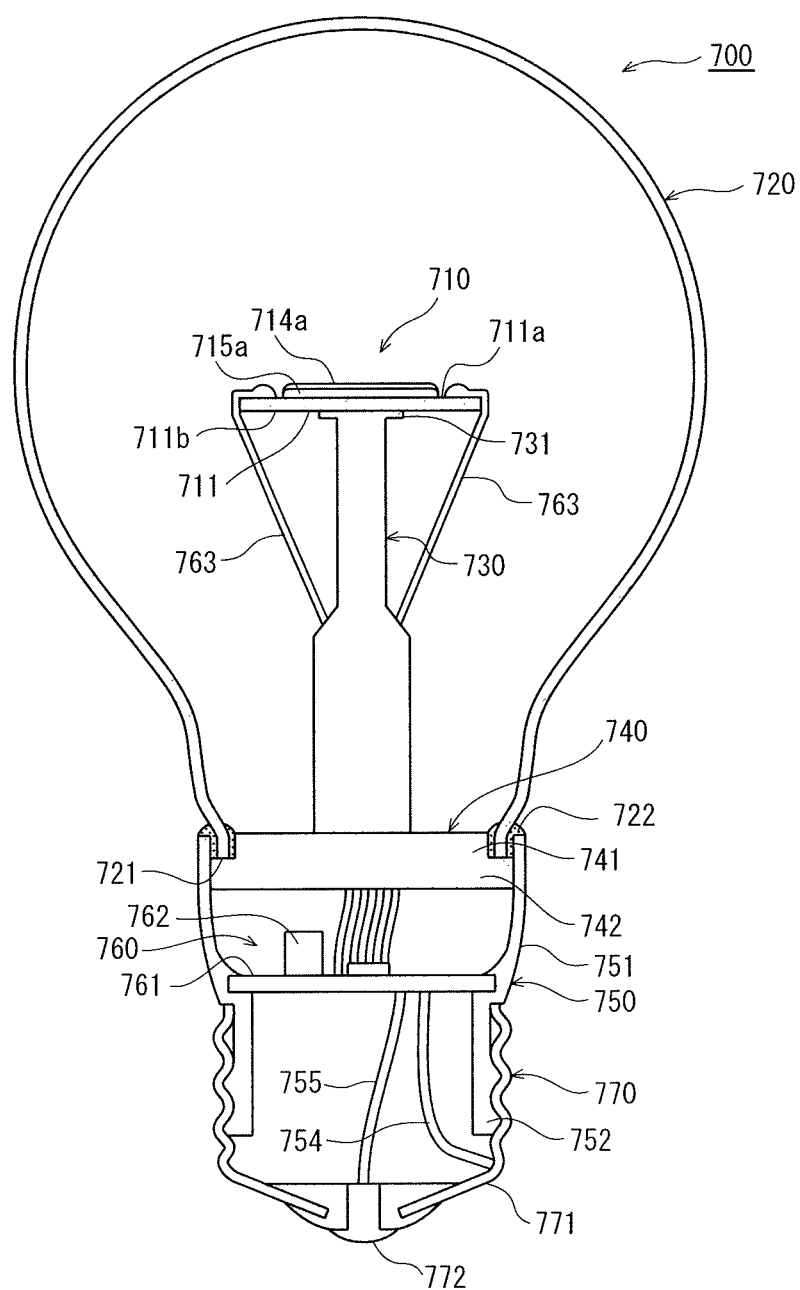
FIG. 16 is a cross-sectional view showing a lighting device according to Modification 5.

FIG. 15 is a perspective view showing a lighting device according to Modification 5. FIG. 16 is a cross-sectional view showing a lighting device according to Modification 5. As shown in FIGS. 15 and 16, a lighting device 700 according to Modification 5 is an LED bulb mainly including a light-emitting module 710, a globe 720, a stem 730, a supporting member 740, a case 750, a circuit unit 760, and a base 770.

The light-emitting module 710 includes a substrate 711, light-emitting elements 120 (omitted from the drawing), light-emitting elements 130 (omitted from the drawing), a first sealer 714, and a second sealer 715. The substrate 711 is a light-transmissive substrate made of light-transmissive material, the light-emitting elements 120 and the light-emitting elements 130 are mounted on the upper surface 711a of the substrate 711. The first sealer 714 is composed of two first sealers, namely a first sealer 714a and a first sealer 714b (hereinafter, simply referred to as "sealer 714", "sealer 714a", or "sealer 714b"). The sealers 714a and 714b individually seal light-emitting element columns that are each composed of a plurality of light-emitting elements 120. The second sealer 715 is composed of two second sealers, namely a second sealer 715a and a second sealer 715b (hereinafter, simply referred to as "sealer 715", "sealer 715a", and "sealer 715b"). The sealers 715a and 715b individually seal light-emitting element columns that are each composed of a plurality of light-emitting elements 130. The light-transmissive materials of the sealers 714 and 715 are the same as the light-transmissive materials of the sealers 140 and 150 in the above embodiment. The light-transmissive material of the sealer 714 includes a wavelength conversion material.

Each of the sealers 714 and 715 has an elongated shape, and the ends thereof in the longitudinal direction are rounded (specifically, each of the ends substantially has a quarter-spherical shape). In plan view, the ends of each of the sealers in the longitudinal direction have a substantially semicircular shape. Also, the cross-section of each of the sealers 714 and 715 along a virtual plane perpendicular to the longitudinal direction of the sealers 714 and 715 has a substantially semi-elliptical shape.

The aspect ratio of each of the sealers 714 and 715 in the cross section thereof in the direction perpendicular to the longitudinal direction is defined in the same manner as in the case of the sealers 140 and 150 in the above embodiment. The aspect ratio $R_{714}$ of each of the sealers 714a and 714b is larger than the aspect ratio $R_{715}$ of the sealers 715a and 715b, and is less than 1.85 times the aspect ratio $R_{715}$. It is more desirable that the ratio of the aspect ratio $R_{714}$ to the aspect ratio $R_{715}$ be in the range of at least 1.25 and at most 1.65. It is further desirable that the ratio of the aspect ratio $R_{714}$ to the aspect ratio $R_{715}$ be in the range of at least 1.5 and at most 1.65.

In this way, the illumination region illuminated by the light from each of the light-emitting elements 120 is substantially the same as the illumination region illuminated by the light from each of the light-emitting elements 130, similarly to the case of the above embodiment. As a result, there is little difference in the illuminance ratio of each of the light-emitting elements 120 and 130 at the central portion and peripheral portion of the illumination region, suppressing color unevenness which is found at the central portion and peripheral portion of the illumination region in the conventional lighting device.

The globe 720 has the same shape as a glass bulb for general incandescent lamps, and houses therein the light-emitting module 710. The globe 720 is made of light-transmissive material such as silica glass or acrylic resin, and is transparent. Hence, the light-emitting module 710, which is housed in the globe 720, is externally visible. Since the light emitting module 710 is disposed substantially at the center of the inside of the globe 720, the lighting device 700 has light distribution characteristics similar to incandescent lamps. Furthermore, since the substrate 711 is light-transmissive, the light emitted by the light-emitting elements 120 and 130 mounted on the upper surface 711a of the substrate 711 passes through the substrate 711 and travels toward the base 770 as well. Accordingly, the lighting device 700 has light distribution characteristics even more similar to incandescent lamps. Note that the globe 720 is not necessarily transparent. Alternatively, the globe 720 may be for example a semi-transparent globe whose inner surface is coated with an opaque white diffusion film made of silica. The light-emitting elements 120 and 130 may be mounted on the lower surface 711b of the substrate 711 as well.

The stem 730 has a rod-like shape, and is disposed so as to extend from near the opening 721 of the globe 720 into the globe 720. The base end of the stem 730 is fixed to the supporting member 740. The light-emitting module 710 is attached to the top end of the stem 730. It is desirable that the stem 730 be made of material having a higher thermal conductivity than the material of the substrate 711 of the light-emitting module 710, so that the stem 730 can conduct heat generated by the light-emitting module 710 to the supporting member 740. For example, metal material such as aluminum or aluminum alloy, or inorganic material such as ceramic, may be used as the material of the stem 730. The light-emitting module 710 is attached to the stem 730 by fixing the substrate 711 of the light-emitting module 710 to a mounting part 731 on the top end of the stem 730 by using fixing material such as adhesive or an adhesive sheet. One example of the adhesive is an adhesive having a high thermal conductivity formed by dispersing fine metal particles in a silicone resin. One example of the adhesive sheet is an adhesive sheet having a high thermal conductivity formed by dispersing a heat conductive filler such as alumina, silica, or titanium oxide in an epoxy resin, and shaping the resin into a sheet and applying an adhesive to both surfaces of the sheet. The high heat conductive adhesive and the high heat conductive adhesive sheet are desirable because they are capable of efficiently conducting heat generated by the light emitting module 710 to the stem 730. Note that the surface of the stem 730 may be processed to be a reflective surface by, for example, mirror finishing through polishing, in order to control the distribution of light.

The supporting member 740 has a disc-like shape, and includes a first supporting part 741 and a second supporting part 742. The first supporting part 741, which is located closer to the light-emitting module 710, is smaller in diameter than the second supporting part 742, which is located closer to the base 770. Due to this difference in diameter, the peripheral portion of the supporting member 740 has a step-like shape. The globe 720 is attached to the supporting member 740 by adhesive 722, with the edge of the opening 721 of the globe 720 being in contact with the step-like portion. Thus, the opening 721 of the globe 721 is closed with the second supporting part 742. As with the stem 730, the supporting member 740 is made of material having a high thermal conductivity such as metal material or inorganic material. Note that the surface of the first supporting part 741 may be processed to be a reflective surface by, for example, mirror finishing through polishing, in order to control the distribution of light.

The case 750 is a tubular member that houses therein the circuit unit 760. The case 750 is made of insulative material such as polybutylene terephthalate (PBT) that contains glass fibers. The case 750 includes a first case part 751, which is located closer to the globe 720, and a second case part 752, which is located closer to the base 770. The case 750 is fixed to the supporting member 740 by the adhesive 722, with the first case part 751 being fitted onto the supporting member 740. The second case part 752 has a screw groove in an outer circumferential surface thereof, and the base 770 is engaged with the second case part 752 by using the screw groove.

The circuit unit 760 includes a circuit board 761 and a plurality of electronic components 762 mounted on the circuit board 761. The circuit unit 760 is housed within the case 750. The circuit unit 760 is equivalent to the circuit unit 4 according to the above embodiment. The light-emitting module 710 and the circuit unit 760 are electrically connected via, for example, feed lines 763 each made of a metal line containing copper (Cu), which has a high thermal conductivity. One end of each feed line 763 is electrically connected to a terminal (omitted from the drawing) of the light-emitting module 710 by soldering or the like, and the other end of each feed line 763 is electrically connected to the circuit unit 760.

The base 770 is of a type defined by JIS, such as of the E-type, and is used as an attachment to a socket (omitted from the drawing) of a common incandescent lamp. The base 770 includes a shell 771, which is also referred to as a cylindrical barrel, and an eyelet 772 having a disc-like shape. The shell 771 and the eyelet 772 are electrically connected to the circuit unit 760 via power feed lines 754 and 755, respectively.

(Modification 6)

Figure 17:
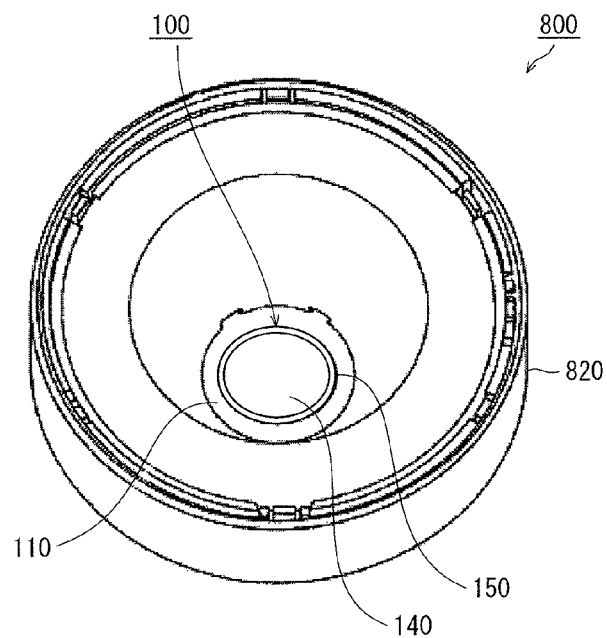
FIG. 17 is a perspective view showing a lighting device according to Modification 6.
Figure 18:
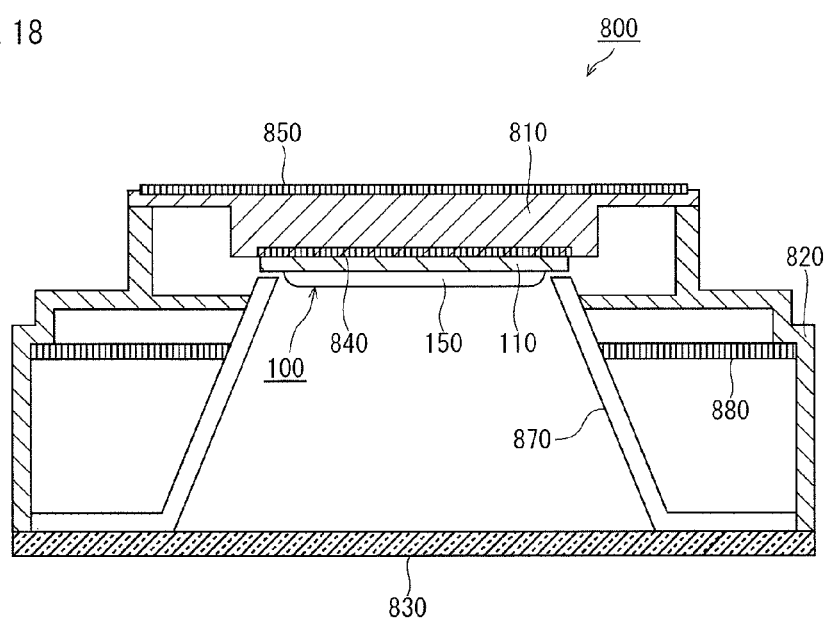
FIG. 18 is a cross-sectional view showing a lighting device according to Modification 6.
Figure 19:
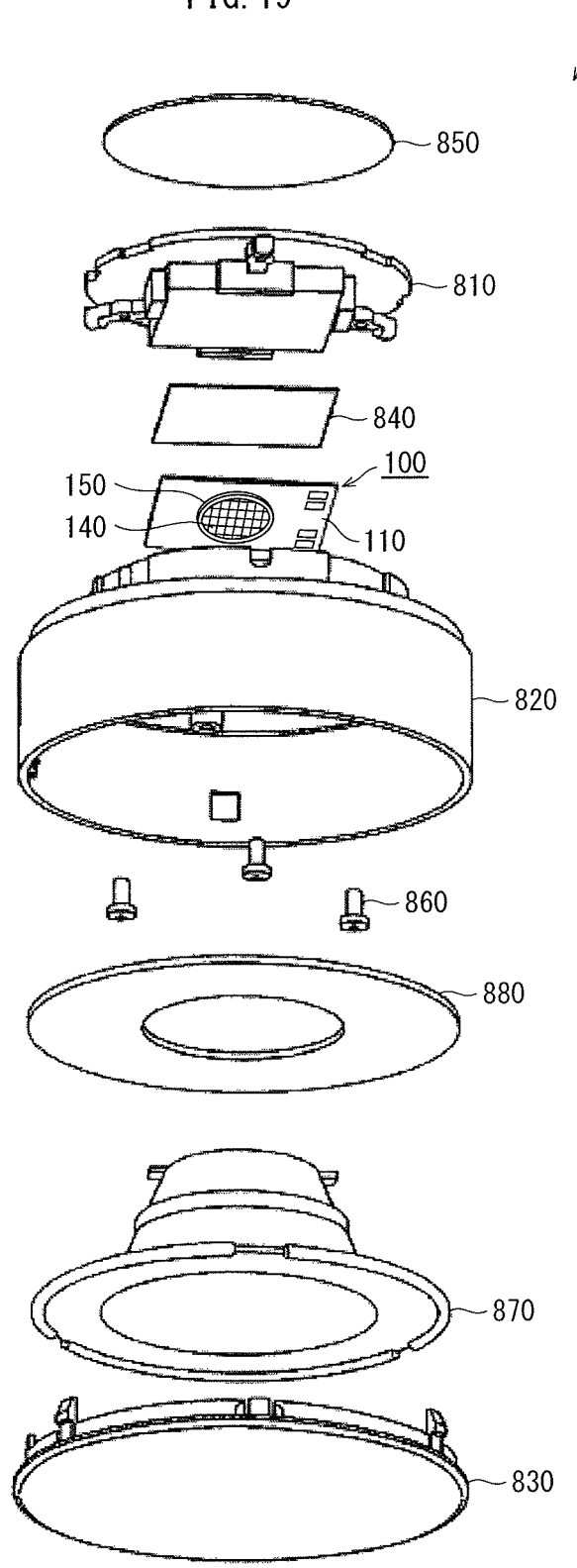
FIG. 19 is an exploded perspective view showing a lighting device according to Modification 6.

FIG. 17 is a perspective view showing a lighting device according to Modification 6. FIG. 18 is a cross-sectional view showing a lighting device according to Modification 6. FIG. 19 is an exploded perspective view showing a lighting device according to Modification 6.

As shown in FIG. 17, a lighting device 800 pertaining to Modification 6 is an LED unit (light engine) having an internal power source circuit, and includes a light-emitting module 100 according to the above embodiment, a mount 810, a case 820, a cover 830, heat conductive sheets 840 and 850, a screw 860 for fixing, a reflection mirror 870 and a circuit unit 880.

The mount 810 serves as a fixing member for fixing the lighting device 800 to a device mounting surface (omitted from the drawing). The mount 810 serves as a seating to which the substrate 110 of the light-emitting module 100 is to be attached. The mount 810 is made, for example, of material having a high thermal conductivity, such as aluminum.

The case 820 is a cylindrical housing that encloses the light-emitting module 100, and has an opening on the side from which light is to be emitted. The case 820 is made, for example, of insulative synthetic resin such as PBT. The case 820 houses therein the light-emitting module 100, the heat conductive sheet 840, the reflection mirror 870, and the circuit unit 880.

The cover 830 is a member for protecting the light-emitting module 100 and so on housed within the case 820. The cover 830 is attached to the case 820 by adhesive, rivets, screws, or the like so as to close the opening on the side of the case 820 from which light is to be emitted. The cover 830 is made of light-transmissive synthetic resin such as polycarbonate resin, so that light emitted from the light-emitting module 100 efficiently transmits through the cover 830. The inside of the case 820 is visible through the cover 830.

As shown in FIG. 18, the heat conductive sheet 840 is disposed between the light-emitting module 100 and the mount 810. The heat conductive sheet 840 thermally connects the substrate 110 and the mount 810 with each other. The heat conductive sheet 840 is a silicone rubber sheet or an acrylic sheet for example, and efficiently conducts heat generated by the light-emitting module 100 to the mount 810.

The heat conductive sheet 850 is disposed between the mount 810 and the device mounting surface. Similarly, the heat conductive sheet 850 is a silicone rubber sheet or an acrylic sheet for example. The heat conductive sheet 850 dissipates, to the device mounting surface, the heat generated by the light-emitting module 100 and conducted to the heat conductive sheet 850 via the heat conductive sheet 840 and the mount 810.

As shown in FIG. 19, the mount 810 and the case 820 are fixed to each other by the screw 860 for fixing.

The reflection mirror 870 is an optical member for efficiently outputting the light from the light-emitting module 100. The reflection mirror 870 is tubular, and has a diameter that gradually increases toward the cover 830. The reflection mirror 870 is made of material having a high reflectivity, such as polycarbonate. Note that the inner surface of the reflection mirror 870 may be coated with a reflective film in order to improve the reflectivity.

The circuit unit 880 includes a circuit board and a plurality of electronic components mounted on the circuit board. The electronic components are omitted from the drawing. The circuit unit 880 has an annular shape with a circular opening, and is disposed around the reflection mirror 870 within the case 820.

(Lighting Apparatus)

The lighting apparatus according to one aspect of the present disclosure is not limited to the lighting apparatus 1 according to the above embodiment.

For example, although the light-emitting module according to the above embodiment is a part of the lighting device built in the lighting apparatus, the light-emitting module does not need to be a part of the lighting device. Instead, the light-emitting module may be an independent component, and may be built directly in the lighting apparatus without intervention of the lighting device.

SUMMARY

With the above-described structure, the light-emitting module according to the above embodiment allows the illumination regions illuminated with the lights of light sources of different emission colors, such as an illumination region illuminated with the light of a white light source and an illumination region illuminated with a red light source, to be substantially the same.

Also, there is little difference in the illuminance ratio of each of the light sources at the central portion and peripheral portion of the illumination region on the illumination target surface. This suppresses color unevenness which is found at the central portion and peripheral portion of the illumination region illuminated by a conventional lighting device.

<<Other Modification>>

Although the structure of the present invention has been described based on the above embodiment and modifications, the structure of the present invention is not limited to those of the above embodiment and modifications. For example, the present invention may be embodied by combining particular components of the above embodiment and modifications according to the need. In addition, note that the materials, the numerical values, and so on described in the embodiment above are nothing more than desirable examples, and accordingly the present invention is not limited by those described in the embodiment above. Furthermore, the structure of the present invention may be modified according to the need, within the scope of the technical idea of the present invention. The present invention is extensively useful for lighting in general.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

The invention claimed is:

1. A light-emitting module, comprising:
   a substrate;
   a first light-emitting element and a second light-emitting element that are each provided on an upper surface of the substrate and each emit light having a different peak wavelength;
   a first sealer that covers the first light-emitting element and includes a light-transmissive material; and
   a second sealer that covers the second light-emitting element wherein
   the first light-emitting element emits light from an upper surface and side surfaces thereof,
   the second light-emitting element mainly emits light from an upper surface thereof,
   a first ratio that is defined as, in a vertical cross section of the first sealer that passes through a center of the upper surface of the first light-emitting element, a ratio of a heightwise distance from a top of the first sealer to the upper surface of the substrate with respect to a width of the first sealer at the upper surface of the substrate, is larger than a second ratio that is defined as, in a vertical cross section of the second sealer that passes through a center of the upper surface of the second light-emitting element, a ratio of a heightwise distance from a top of the second sealer to the upper surface of the second light-emitting element with respect to a width of the second sealer at a position corresponding to the upper surface of the second light-emitting element, and a ratio of the first ratio to the second ratio is less than 1.85.

2. The light-emitting module of claim 1, wherein the ratio of the first ratio to the second ratio is at least 1.25 and at most 1.65.

3. The light-emitting module of claim 1, further comprising:
a third light-emitting element that emits light having the same peak wavelength as the first light-emitting element; and
a fourth light-emitting element that emits light having the same peak wavelength as the second light-emitting element, wherein
the third light-emitting element is provided on the upper surface of the substrate and aligned with the first light-emitting element to form a first light-emitting element column,
the fourth light-emitting element is provided on the upper surface of the substrate and aligned with the second light-emitting element to form a second light-emitting element column, and
the first sealer and the second sealer have a strip-like shape, and respectively cover the first light-emitting element column and the second light-emitting element column.

4. The light-emitting module of claim 1, wherein the light emitted by the first light-emitting element is blue light, and the light emitted by the second light-emitting element is red light.

5. A lighting device including the light-emitting module of claim 1.

6. A lighting apparatus including the light-emitting module of claim 1.

7. The light-emitting module of claim 2, wherein the ratio of the first ratio to the second ratio is at least 1.5 and at most 1.65.

8. The light-emitting module of claim 4, wherein the first sealer includes a wavelength conversion material, the wavelength conversion material converting a wavelength of a portion of the blue light into a wavelength of light having a different color, so as to emit, as light from the light-emitting module as a whole, white light obtained by mixing the blue light, the red light, and the light having the different color.

9. The light-emitting module of claim 4, wherein the peak wavelength of the blue light is at least 440 nm and at most 470 nm, and the peak wavelength of the red light is at least 600 nm and at most 660 nm.

* * * * *